(12) United States Patent
Humphries et al.

(10) Patent No.: US 8,618,420 B2
(45) Date of Patent: Dec. 31, 2013

(54) APPARATUS WITH A WIRE BOND AND METHOD OF FORMING THE SAME

(75) Inventors: Mark Robson Humphries, Essex (GB); Frank Ferdinandi, Cambridge (GB); Rodney Edward Smith, Essex (GB)

(73) Assignee: Semblant Global Limited, London (GB)

( * ) Notice: Subject to any disclaimer, the term of this patent is extended or adjusted under 35 U.S.C. 154(b) by 104 days.

(21) Appl. No.: 13/030,684

(22) Filed: Feb. 18, 2011

(65) Prior Publication Data

US 2011/0186334 A1    Aug. 4, 2011

Related U.S. Application Data

(63) Continuation of application No. 13/059,602, filed as application No. PCT/GB2009/001966 on Aug. 11, 2009.

(30) Foreign Application Priority Data

Aug. 18, 2008 (GB) .................................. 0815094.8
Aug. 18, 2008 (GB) .................................. 0815095.5
Aug. 18, 2008 (GB) .................................. 0815096.3

(51) Int. Cl.
*H05K 1/09* (2006.01)

(52) U.S. Cl.
USPC ......... 174/251; 174/250; 361/308.3; 228/203

(58) Field of Classification Search
USPC ................. 174/251, 250; 361/308.3; 228/203
See application file for complete search history.

(56) References Cited

U.S. PATENT DOCUMENTS

| 3,737,339 | A | * | 6/1973 | Alsberg et al. ................. 428/209 |
| 3,745,536 | A | | 7/1973 | Klehm, Jr. |
| 3,931,454 | A | | 1/1976 | Sprengling |
| 4,268,568 | A | | 5/1981 | Sard et al. |

(Continued)

FOREIGN PATENT DOCUMENTS

| DE | 10 2007 06278 | 7/2008 |
| EP | 0355955 A2 | 2/1990 |

(Continued)

OTHER PUBLICATIONS

Intellectual Property Office, Examination Report under Section 18(3), U.K. Application No. GB0815094.8, date of search May 31, 2011, 3 pages.

(Continued)

*Primary Examiner* — Timothy Thompson
*Assistant Examiner* — Andargie M Aychillhum
(74) *Attorney, Agent, or Firm* — Baker Botts L.L.P.

(57) ABSTRACT

In some embodiments, a printed circuit board (PCB) comprises a substrate comprising an insulating material. The PCB further comprises a plurality of conductive tracks attached to at least one surface of the substrate. The PCB further comprises a multi-layer coating deposited on the at least one surface of the substrate. The multi-layer coating (i) covers at least a portion of the plurality of conductive tracks and (ii) comprises at least one layer formed of a halo-hydrocarbon polymer. The PCB further comprises at least one electrical component connected by a solder joint to at least one conductive track, wherein the solder joint is soldered through the multi-layer coating such that the solder joint abuts the multi-layer coating.

15 Claims, 12 Drawing Sheets

(56) References Cited

U.S. PATENT DOCUMENTS

| | | | |
|---|---|---|---|
| 6,183,883 B1 | 2/2001 | Mori et al. | |
| 6,335,224 B1 | 1/2002 | Peterson et al. | |
| 6,650,013 B2 * | 11/2003 | Yin et al. | 257/736 |
| 6,852,931 B2 * | 2/2005 | Hedler et al. | 174/260 |
| 7,112,265 B1 | 9/2006 | McAleer et al. | |
| 7,465,478 B2 * | 12/2008 | Collins et al. | 427/523 |
| 2004/0026775 A1 | 2/2004 | Hecht et al. | |
| 2006/0103030 A1 | 5/2006 | Aoki et al. | |
| 2008/0176096 A1 | 7/2008 | Cheng | |

FOREIGN PATENT DOCUMENTS

| | | |
|---|---|---|
| EP | 0393832 A1 | 3/1990 |
| EP | 1091201 A2 | 4/2001 |
| GB | 1 399 252 A | 7/1975 |
| JP | 59097029 A | 6/1984 |
| JP | 2285648 A | 11/1990 |
| JP | 8288331 A | 11/1996 |
| JP | 11251356 A | 9/1999 |
| JP | 2002 329741 A | 11/2002 |
| JP | 2004 184340 A | 7/2004 |
| WO | WO 2008/102113 A2 | 8/2008 |

OTHER PUBLICATIONS

Anonymous: "Circuit Board Soldering through Conformal Coating" Research Disclosure, Mason Publications, Hampshire, GB, vol. 93, No. 68, Sep. 1, 1998, XP007112948, Issn: 0374-4353, Sep. 1, 1998.
PCT Notification of Transmittal of the Intl. Search Report and the Written Opinion of the Intl. Searching Authority, or the Declaration, re PCT/GB2009/001966 mailed Oct. 23, 2008, Apr. 27, 2010.

* cited by examiner

APPARATUS WITH A WIRE BOND AND METHOD OF FORMING THE SAME

RELATED APPLICATIONS

The present application is a continuation application of U.S. patent application Ser. No. 13/059,602, filed Feb. 17, 2011, entitled "Apparatus with a Multi-Layer Coating and Method of Forming the Same," which is a U.S. National Stage Application of International Application No. PCT/GB2009/001966, filed Aug. 11, 2009 entitled "Halo-Hydrocarbon Polymer Coating," which claims priority to United Kingdom Application No. GB 0815094.8, filed Aug. 18, 2008, entitled "Wire Bonding;" United Kingdom Application No. GB 0815095.5, filed Aug. 18, 2008, entitled "Devices;" and United Kingdom Application No. GB 0815096.3 filed Aug. 18, 2008, entitled "Printed Circuit Boards."

TECHNICAL FIELD OF THE INVENTION

This disclosure relates generally to polymer coatings and, more specifically, to a halo-hydrocarbon polymer coating for electrical devices.

BACKGROUND OF THE INVENTION

Many electrical devices comprise electrical components that are soldered to printed circuit boards (PCBs). The metal surfaces on the electrical components and PCBs often oxidize or corrode before being soldered together. The oxidation or corrosion of the metal surfaces may prevent strong solder joints from being formed or may reduce the lifetime of such joints. As a result, the electrical devices may be defective or may not function as long as desired.

SUMMARY OF THE INVENTION

In some embodiments, a printed circuit board (PCB) comprises a substrate comprising an insulating material. The PCB further comprises a plurality of conductive tracks attached to at least one surface of the substrate. The PCB further comprises a coating deposited on the at least one surface of the substrate. The coating may cover at least a portion of the plurality of conductive tracks and may comprise at least one halo-hydrocarbon polymer. The PCB may further comprise at least one conductive wire that is connected by a wire bond to at least one conductive track, wherein the wire bond is formed through the coating without prior removal of the coating such that the wire bond abuts the coating.

In other embodiments, a PCB comprises a substrate comprising an insulating material. The PCB further comprises a plurality of conductive tracks attached to at least one surface of the substrate. The PCB further comprises a multi-layer coating deposited on the at least one surface of the substrate. The multi-layer coating (i) covers at least a portion of the plurality of conductive tracks and (ii) comprises at least one layer formed of a halo-hydrocarbon polymer. The PCB further comprises at least one electrical component connected by a solder joint to at least one conductive track, wherein the solder joint is soldered through the multi-layer coating such that the solder joint abuts the multi-layer coating.

In yet other embodiments, an apparatus comprises a substrate comprising an insulating material. The apparatus further comprises a first contact attached to at least one surface of the substrate. The apparatus further comprises a coating deposited on at least one surface of the first contact. The coating may comprise at least one halo-hydrocarbon polymer such that the first contact is operable to conduct an electrical signal through the coating to a second contact without removal of the coating.

One or more embodiments may comprise a printed circuit board to which a solder connection is to be made. The surface of said printed circuit board may have a multi-layer coating comprising one or more polymers. The polymers may be selected from halo-hydrocarbon polymers and non-halo-hydrocarbon polymers. The thickness of the multi-layer coating may be from 1 nm to 10 µm.

One or more embodiments may comprise a printed circuit board to which a solder connection is to be made. The surface of said printed circuit board may have a multi-layer coating comprising one or more polymers. According to certain embodiments, there may be no solder; or essentially no solder, between said coating and conductive tracks of said printed circuit board.

One or more embodiments may comprise a printed circuit board to which a solder connection is to be made. The surface of said printed circuit board may have a multi-layer coating comprising one or more polymers. The multi-layer coating may comprise one or more layers of discrete polymers.

One or more embodiments may comprise a printed circuit board to which a solder connection is to be made. The surface of said printed circuit board may have a multi-layer coating comprising one or more polymers. The multi-layer coating may comprise graded layers of different polymers.

One or more embodiments may comprise a printed circuit board to which a solder connection is to be made. The surface of said printed circuit board may have a multi-layer coating comprising one or more polymers. The multi-layer coating may comprise two or more layers.

One or more embodiments may comprise a printed circuit board to which a solder connection is to be made. The surface of said printed circuit board may have a multi-layer coating comprising one or more polymers. The first layer, which may be in contact with the surface of the printed circuit board, may comprise a non-halo-hydrocarbon polymer.

One or more embodiments may comprise a printed circuit board to which a solder connection is to be made. The surface of said printed circuit board may have a multi-layer coating comprising one or more polymers.

In some embodiments, there may be no, or essentially no, metal halide layer on the surface of the printed circuit board. In some embodiments, a method of making a connection to a printed circuit board having a multi-layer coating comprises applying solder, and optionally flux, to the printed circuit board at a temperature and for a time such that the solder bonds to the metal and the composition is locally dispersed and/or absorbed and/or vaporised. According to certain embodiments one or more factors are selected such that (a) there is good solder flow, (b) solder covers the substrate (typically a conductive track or pad) on the printed circuit board, and (c) a strong solder joint is generated. The one or more factors may comprise (a) the substrate characteristics, (b) the coating characteristics, (c) the solder/flux characteristics, (d) the soldering profile (including time and temperature), (d) the process to disperse the coating, and (e) the process to control solder flow around the joint.

One or more embodiments may comprise a method of modifying the wetting characteristics of a coating comprising one or more halo-hydrocarbon polymers on a printed circuit board by plasma etching, plasma activation, plasma polymerisation and coating, and/or liquid based chemical etching.

One or more embodiments may comprise a method of modifying the wetting characteristics of a multilayer coating by plasma etching, plasma activation, plasma polymerisation and coating, and/or liquid based chemical etching.

In some embodiments, a printed circuit board comprises a substrate and conductive tracks. The surfaces of said printed circuit board may be completely or substantially encapsulated with either (a) a coating of a composition comprising one or more halo-hydrocarbon polymers, or (b) a multi-layer coating comprising one or more polymers selected from halo-hydrocarbon polymers and non-halo-hydrocarbon polymers, at a thickness of 1 nm to 10 μm. According to certain embodiments, the substrate comprises a material that absorbs water or solvent based chemicals. In some embodiments, the substrate comprises epoxy resin bonded glass fabrics, synthetic resin bonded paper, phenolic cotton paper, cotton paper, epoxy, paper, cardboard, textiles, or natural or synthetic wood based materials.

In some embodiments, a method of preparing a printed circuit board comprises: (a) providing a printed circuit board having an environmentally exposed surface, (b) cleaning the surface in a plasma chamber, using gases such as hydrogen, argon or nitrogen, and (c) applying to the surface a thickness of 1 nm to 10 μm of a composition comprising a halo-hydrocarbon polymer by plasma deposition, said coating optionally following the 3D form of the printed circuit board.

In some embodiments, a method of preparing a printed circuit board comprises: (a) providing a printed circuit board having an environmentally exposed surface, (b) cleaning the surface in a plasma chamber, using gases such as hydrogen, argon or nitrogen, (c) applying to the surface a thickness of 1 nm to 10 μm of a multilayer coating comprising one or more polymers by plasma deposition. The polymers may be selected from halo-hydrocarbon polymers and non-halo-hydrocarbon polymers. The multi-layer coating may optionally follow the 3D form of the printed circuit board.

One or more embodiments may comprise using a composition comprising a halo-hydrocarbon polymer as a flame-retardant coating for printed circuit boards.

In some embodiments, a method of making a connection between a wire and a substrate may use a wire bonding technique. The wire and/or the substrate may be coated with a composition that comprises one or more halo-hydrocarbon polymers at a thickness of from 1 nm to 2 μm. In some embodiments, the wire bonding technique is ball/wedge bonding. In other embodiments, the wire bonding technique is wedge/wedge bonding. According to certain embodiments, the wire comprises gold, aluminium, silver, copper, nickel, or iron. In some embodiments, the substrate comprises copper, gold, silver, aluminium, tin, conductive polymers, or conductive inks.

In some embodiments, a method of making a connection between a wire and a substrate may use a wire bonding technique. In some embodiments, only the wire is coated with a composition that comprises one or more halo-hydrocarbon polymers at a thickness of from 1 nm to 2 μm. In other embodiments, only the substrate is coated with a composition that comprises one or more halo-hydrocarbon polymers at a thickness of from 1 nm to 2 μm.

In some embodiments, a method of making a connection between a wire and a substrate may use a wire bonding technique. The wire and/or the substrate may be coated with a composition that comprises one or more halo-hydrocarbon polymers at a thickness of from 10 nm to 100 nm.

In some embodiments, a method of making a connection between a wire and a substrate may use a wire bonding technique. The wire and/or the substrate may be coated with a composition that comprises one or more halo-hydrocarbon polymers. In some embodiments, the halo-hydrocarbon polymer is a fluoro-hydrocarbon.

In some embodiments, a method of making a connection between a wire and a substrate may use a wire bonding technique. The wire and/or the substrate may be coated with a composition that comprises one or more halo-hydrocarbon polymers. In some embodiments, the halo-hydrocarbon polymer coating remains intact after wire bonding except in the area where the connection is made. According to certain embodiments, the halo-hydrocarbon polymer coating is removed and/or dispersed by the action of the wire bonding process, without the coating being removed in a separate pre-processing step. In some embodiments, an additional coating comprising one or more halo-hydrocarbon polymers is applied after formation of the connection.

In some embodiments, a halo-hydrocarbon polymer may be used to prevent oxidation and/or corrosion of a wire and/or a substrate prior to formation of a bond between the wire and the substrate by a wire bonding technique. According to certain embodiments, a halo-hydrocarbon polymer may be used to allow formation of a connection between a wire and a substrate under a non-inert atmosphere using a wire bonding technique.

In some embodiments, a device comprises one or more contacts. At least one of said contacts may be coated with a composition that comprises one or more halo-hydrocarbon polymers at a thickness of from 1 nm to 2 μm.

In some embodiments, a device comprises an upper contact and a lower contact. The device may be configured such that the upper contact and lower contact are capable of being brought into electrical contact with each other. The upper and/or lower contacts may be coated with a composition that comprises one or more halo-hydrocarbon polymers at a thickness of from 1 nm to 2 μm. In some embodiments, the upper and lower contacts comprise stainless steel, silver, carbon, nickel, gold, tin, or alloys thereof. In some embodiments, the device is a keypad.

In some embodiments, a sensor device comprises one or more sensor elements and each sensor element comprises a contact. The contacts may be coated with a composition that comprises one or more halo-hydrocarbon polymers at a thickness of from 1 nm to 2 μm. In some embodiments, the one or more sensor elements are electrodes. In some embodiments, the contacts comprise carbon, conductive inks, and/or silver loaded epoxy.

In some embodiments, a device comprises one or more contacts. At least one of said contacts may be coated with a composition that comprises one or more halo-hydrocarbon polymers at a thickness of from 10 nm to 100 nm.

In some embodiments, a device comprises one or more contacts. At least one of said contacts may be coated with a composition that comprises one or more halo-hydrocarbon polymers. In some embodiments, the electrical conductivity of the coating in the z-axis is higher than the electrical conductivity in the x-axis and y-axis. In some embodiments, the halo-hydrocarbon polymer coating provides environmental protection. In some embodiments, the electrical resistance of the coating can be optimised for different applications.

In some embodiments, a device comprises one or more contacts. At least one of said contacts may be coated with a composition that comprises one or more halo-hydrocarbon polymers. A method for preparing the device may comprise depositing the halo-hydrocarbon polymer coating by plasma deposition. In some embodiments, the halo-hydrocarbon polymer is a fluoro-hydrocarbon.

In some embodiments, a sensor element comprises a contact. The contact may be coated with a composition that comprises one or more halo-hydrocarbon polymers at a thickness of from 1 nm to 2 µm.

One or more embodiments may comprise a method of protecting one or more upper and lower contacts in a device. The device may be configured such that said upper contact and lower contact are capable of being brought into electrical contact with each other. The method may comprise coating the contacts with a composition that comprises one or more halo-hydrocarbon polymers at a thickness of from 1 nm to 2 µm. In some embodiments, the coating is applied prior to manufacture of the device.

One or more embodiments may comprise a method of protecting one or more contacts in a sensor device. The method may comprise coating the contact pads with a composition that comprises one or more halo-hydrocarbon polymers at a thickness of from 1 nm to 2 µm. In some embodiments, the coating is applied prior to manufacture of the device. In some embodiments, the deposition technique is plasma deposition.

In some embodiments, a halo-hydrocarbon polymer may be used to coat a surface or surfaces of contacts in a device comprising an upper contact and a lower contact. The device may be configured such that said upper contact and lower contact are capable of being brought into electrical contact with each other. In some embodiments, a halo-hydrocarbon polymer may be used to coat a surface or surfaces of a contact in a sensor device comprising one or more sensor elements.

Applying the coating to a PCB or other device may provide several advantages. Various embodiments may have none, some, or all of these advantages. One advantage is that the coating may prevent conductive tracks on a PCB from oxidizing. A PCB is often stored for some period of time before electrical components are soldered to the PCB. If the PCB is uncoated, the conductive tracks on the PCB may oxidize during storage. An oxidation layer on a conductive track may prevent or hinder the soldering of an electrical component to the conductive track. By applying the coating to the PCB prior to storage, a manufacturer may prevent the conductive tracks on the PCB from oxidizing. By preventing oxidation, the coating may permit the formation of strong solder joints on the PCB.

Another advantage is that the coating may allow an electrical component to be soldered through the coating without the prior removal of the coating. The coating may comprise one or more halo-hydrocarbon polymers. In some embodiments, the heat, solder, and/or flux applied during the soldering process may selectively alter the coating on the particular area of the PCB where the solder joint is to be formed. In some embodiments, the soldering process may remove the coating only in the area of the solder joint. Accordingly, once the solder joint is formed, the coating may extend up to (e.g., abut) the solder joint. As a result, a manufacturer may not need to etch or otherwise remove the coating prior to the soldering process. By eliminating the need for a separate etching or removal step, the coating may make the PCB assembly process simpler, less expensive, and/or less time-consuming.

Another advantage is that the coating may prevent the corrosion of a PCB. The coating may provide a barrier between a PCB and corrosive gases and/or liquids. In some embodiments, the coating may prevent liquids and/or moisture from reaching the substrate and/or conductive tracks of the PCB. The coating may prevent the formation of dendrites that contribute to short circuits and/or leakage between contacts.

Another advantage is that the coating may exhibit conductivity along an axis pointing into the plane of a coated surface (the "z-axis") while acting as an insulator along the axes parallel to the coated surface. Accordingly, the coating may be applied to a conductive contact without hindering the ability of such contact to transmit an electrical signal to a mating contact. Thus, in some embodiments, the coating may protect contacts from oxidation and/or corrosion without hindering the conductivity of the contacts.

Other advantages will be readily apparent to one skilled in the art from the description and the appended claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE INVENTION

Figure 1A:
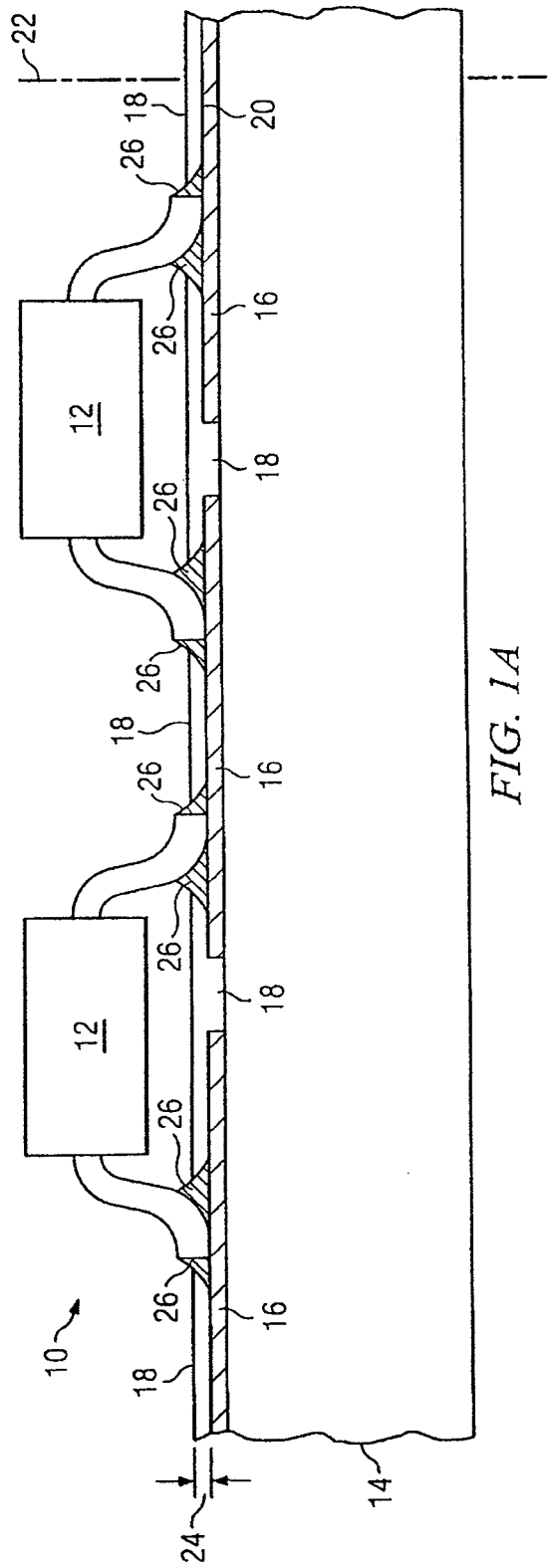
FIGS. 1A-C illustrate a printed circuit board (PCB), according to certain embodiments.

FIG. 1A illustrates a printed circuit board (PCB) 10, according to certain embodiments. PCB 10 may mechanically support and/or electrically connect one or more electrical components 12 associated with an electrical circuit. PCB 10 may comprise a substrate 14, one or more conductive tracks 16, a coating 18, and one or more electrical components 12.

Substrate 14 in PCB 10 may comprise one or more boards that mechanically support elements of a circuit. For example, conductive tracks 16 and/or electrical components 12 may be affixed to at least one surface of substrate 14. Substrate 14 may comprise any suitable insulating material that prevents substrate 14 from shorting the circuit of PCB 10. In some embodiments, substrate 14 in PCB 10 comprises an epoxy laminate material, a synthetic resin bonded paper, an epoxy resin bonded glass fabric (ERBGH), a composite epoxy material (CEM), a phenolic cotton paper, and/or any other suitable type and/or combination of insulating material. According to certain embodiments, substrate 14 comprises paper, cardboard, natural and/or synthetic wood based materials, and/or other suitable textiles. In some embodiments, substrate 14 comprises a flame retardant material such as, for example, Flame Retardant 2 (FR-2) and/or Flame Retardant 4 (FR-4). Substrate 14 in PCB 10 may comprise a single layer of an insulating material or multiple layers of the same or different insulating materials with or without conductive tracks 16 on any layer.

One or more conductive tracks 16 may be affixed to at least one surface of substrate 14. Conductive track 16 is generally operable to conduct electrical signals between two or more components of the circuit of PCB 10. Thus, conductive track 16 may function as a signal trace and/or wire for conducting signals. In some embodiments, conductive tracks 16 comprise regions referred to as contact pads. A contact pad of conductive track 16 may be configured to support and/or connect with electrical component 12. Conductive track 16 may comprise any suitable conductive material such as, for example, gold, tungsten, copper, silver, aluminium, and/or tin. In some embodiments, conductive track 16 may comprise one or more conductive polymers and/or conductive inks.

Conductive track 16 may be formed on substrate 14 of PCB 10 using any suitable technique. In some embodiments, conductive track 16 may be formed on substrate 14 using a "subtractive" technique. For example, a layer of metal (e.g., copper foil, aluminium foil, etc.) may be bonded to a surface of substrate 14 and then the unwanted portions of the metal layer may be removed, leaving the desired conductive tracks 16. The unwanted portions of the metal layer may be removed from substrate 14 by chemical etching, photo-etching, milling, and/or any suitable technique. In other embodiments, conductive tracks 16 may be formed on substrate 14 using an "additive" technique such as, for example, electroplating, deposition using a reverse mask, and/or any geometrically controlled deposition process.

In some embodiments, coating 18 may be deposited over one or more conductive tracks 16 on substrate 14 of PCB 10. Coating 18 may protect conductive tracks 16 from oxidation, corrosion, and/or other environmental hazards (e.g., swelling caused by liquids and/or moisture). In some embodiments, coating 18 is deposited over conductive tracks 16 on substrate 14 prior to soldering electrical components 12 to conductive tracks 16 of PCB 10. Thus, there may be no solder, or essentially no solder, at an interface 20 between coating 18 and conductive tracks 16 of PCB 10. Coating 18 may permit electrical components 12 to be selectively soldered through coating 18 to conductive tracks 16 without prior removal of coating 18. In addition, or alternatively, coating 18 may permit wires to be wire bonded through coating 18 to conductive tracks 16 without prior removal of coating 18. In addition, or alternatively, coating 18 may exhibit low resistance and/or impedance along the z-axis 22 (i.e., axis pointing into the surface of PCB 10 to which conductive tracks 16 are affixed) such that an electrical signal and/or current may be conducted through coating 18 between conductive track 16 and electrical component 12 of PCB 10. In this context, the term "current" may refer to the flow of electric charge and the term "signal" may refer to a time-varying and/or spatial-varying electric quantity (e.g., voltage, current, or field strength whose modulation represents coded information). The signal may be any suitable type of signal such as, for example, a field induced signal or a current induced signal.

Coating 18 may comprise any suitable material that protects conductive tracks 16 from oxidation and/or corrosion. In some embodiments, coating 18 comprises one or more halo-hydrocarbon polymer materials. The term "polymer" may refer to polymers formed in-situ from single and/or multiple monomers, linear, branched, grafted, and/or crosslinked copolymers, oligomers, multipolymers, multimonomer polymers, polymer mixtures, blends and/or alloys of polymers, grafted copolymers, and/or interpenetrating networks of polymers (IPNs).

The term "halo-hydrocarbon polymer" may refer to polymers with a straight or branched chain or ring carbon structure with zero, one, two, or three halogen atoms bound to each carbon atom in the structure. The halogen atoms in the halo-hydrocarbon polymer may be fluorine, chlorine, bromine, and/or iodine. Preferably, the halo-hydrocarbon polymer is a fluoro-hydrocarbon polymer, a chiaro-hydrocarbon polymer, or a fluoro-chloro-hydrocarbon polymer wherein zero, one, two, or three fluorine or chlorine atoms are bonded to each carbon atom in the chain. In some embodiments, the chain may be conjugated or highly conjugated or have extended conjugated chains, rings, and/or branches.

The halogen atoms in the halo-hydrocarbon polymer in coating 18 could be the same halogen atoms (e.g., fluorine) or a mixture of halogen atoms (e.g., fluorine and chlorine). The term "halo-hydrocarbon polymer" as used herein may include polymers that comprise one or more unsaturated groups, such as carbon-carbon double and/or triple bonds, and/or polymers that comprise one or more heteroatoms (atoms which are not carbon, hydrogen, or a halogen) such as, for example, nitrogen, sulphur, and/or oxygen. Preferably, the halo-hydrocarbon polymer in coating 18 comprises less than five percent heteroatoms as a proportion of the total number of atoms in the polymer. The halo-hydrocarbon polymer may have any suitable molecular weight. The molecular weight of the halo-hydrocarbon polymer may be selected according to the desired functionality of coating 18. In a preferred embodiment, the molecular weight of the halo-hydrocarbon polymer in coating 18 is greater than 500 amu. The halo-hydrocarbon polymer chains in coating 18 may be straight or branched. In some embodiments, there is crosslinking between the polymer chains in coating 18.

Examples of preferred halo-hydrocarbon polymers include:

Polytetrafluoroethylene (PTFE), PTFE type material, fluorinated-hydrocarbons, chlorinated-fluorinated-hydrocarbons, halogenatedhydrocarbons, and halo-hydrocarbons as well as copolymers, oligomers, multipolymers, multimonomer polymers, polymer mixtures, interpenetrating polymer networks (IPNs), blends, alloys, branched chain polymers, grafted copolymers, and cross-linked variants of these materials. In a preferred embodiment, the halo-hydrocarbon polymer In coating 18 is a polytetrafluoroethylene (PTFE) type material and, in particular, modified or unmodified polytetrafluoroethylene (PTFE).

Polychlorotrifluoroethylene (PCTFE) and copolymers, oligomers, multipolymers, multimonomer polymers, polymer mixtures, interpenetrating polymer networks (IPNs), blends, alloys, branched chain polymers, grafted copolymers, and cross-linked variants of these materials.

Ethylene copolymer of polychlorotrifluoroethylene (EPCTFE) and copolymers, oligomers, multipolymers, multimonomer polymers, polymer mixtures, interpenetrating polymer networks (IPNs), blends, alloys, branched chain polymers, grafted copolymers, and cross-linked variants of these materials.

Copolymer of ethylene and tetrafluoroethylene (ETFE); copolymer of tetrafluoroethylene and hexafluoropropylene (FEP); copolymer of tetrafluoroethylene and perfluorovinyl ether (PFA); polymer of vinylidenefluoride (PYDF); copolymer of tetrafluoroethylene, hexafluoropropylene and vinylidenefluoride (THY); copolymer of vinylidene fluoride and hexafluoropropylene (PYDF-HFP); copolymer of tetrafluoroethylene and perfluoromethylvinylether (MFA); copolymer of ethylene, tetrafluoroethylene and hexafluoropropylene (EFEP); copolymer of hexyluoropropylene, tetrafluoroethylene and ethylene (HTE); copolymer of vinylidene fluoride and chlorotrifluoroethylene; and/or other fluoroplastics including copolymers, oligomers, multipolymers, multimonomer polymers, polymer mixtures, interpenetrating polymer networks (IPNs), blends, alloys, branched chain polymers, grafted copolymers, and cross-linked variants of these materials.

Figure 1B:
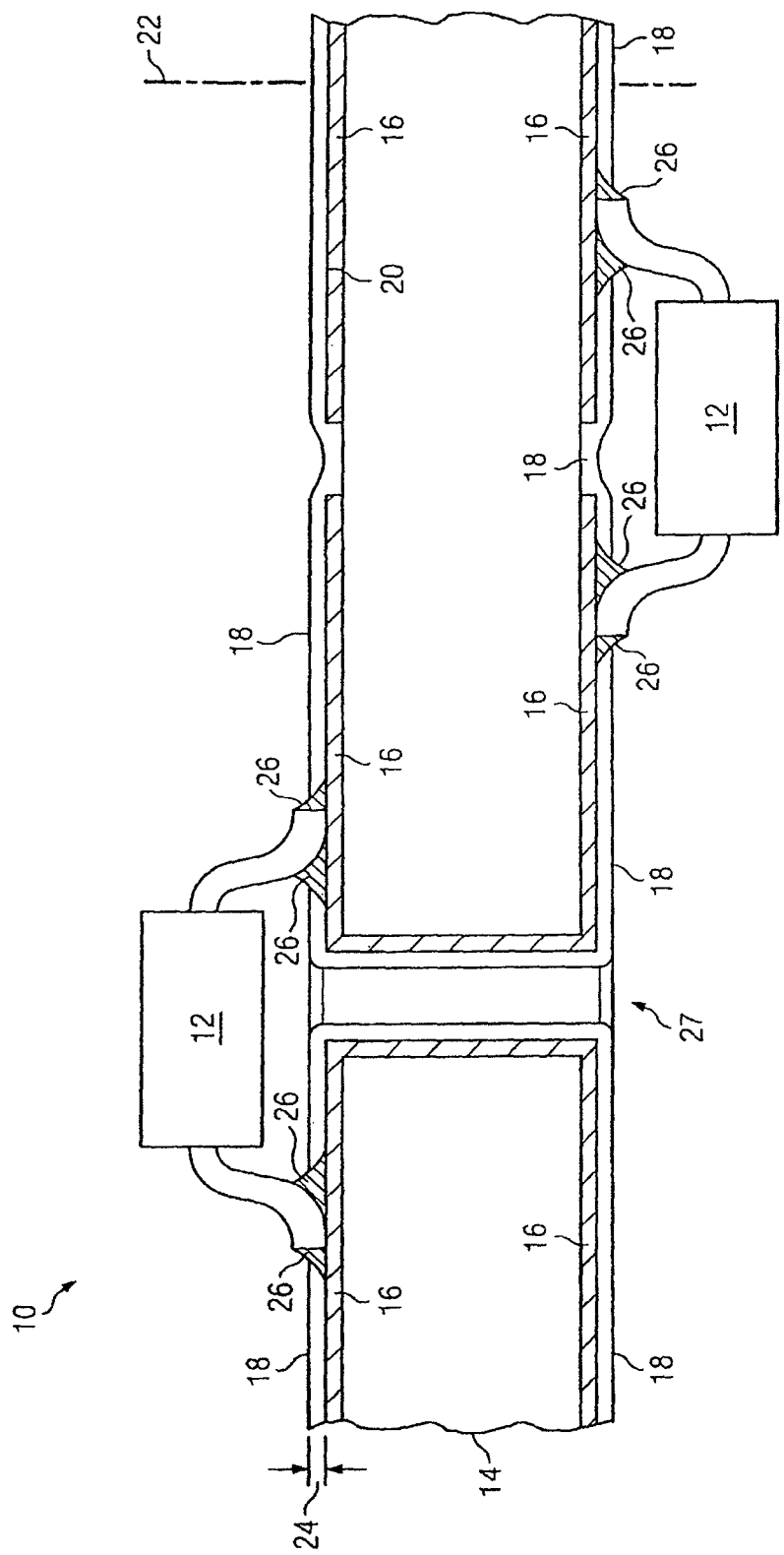

Coating 18 on PCB 10 may comprise a single layer or multiple layers of halo-hydrocarbon polymers. In some embodiments, coating 18 comprises at least one layer of halo-hydrocarbon polymers and at least one layer of a metal halide (e.g., metal fluoride) on a conductive surface. Coating 18 may have any suitable thickness 24. In some embodiments, thickness 24 of coating 18 may be from one nanometers (nm) to ten micrometers (μm). In other embodiments, thickness 24 of coating 18 may be from one nm to two μm. In yet other embodiments, thickness 24 of coating 18 may be from one nm to five hundred nm. In yet other embodiments, thickness 24 of coating 18 may be from three nm to five hundred nm. In yet other embodiments, thickness 24 of coating 18 may be from ten nm to five hundred nm. In yet other embodiments, thickness 24 of coating 18 may be from ten nm to two hundred and fifty nm. In yet other embodiments, thickness 24 of coating 18 may be from ten nm to thirty nm. In yet other embodiments, coating 18 is a monolayer of a halo-hydrocarbon polymer (having thickness 24 of a few angstroms (Å)). In a preferred embodiment, thickness 24 of coating 18 is from ten nm to one hundred nm in various gradients, with one hundred nm being a preferred thickness 24. In some embodiments, coating 18 may be deposited on substrate 14 and conductive tracks 16 such that an exposed surface of coating 18 is substantially flat (as illustrated in FIG. 1A). In other embodiments, coating 18 may be deposited on substrate 14 and conductive tracks 16 such that an exposed surface of coating 18 is not flat but instead conforms to a three-dimensional surface of substrate 14 and conductive tracks 16 (as illustrated in FIG. 1B).

In some embodiments, coating 18 may be deposited on conductive tracks 16 and/or substrate 14 as a continuous film. According to certain embodiments, the continuous film may be substantially free of pores such as, for example, voids, cracks, holes, and/or defects. In some embodiments, the porosity of coating 18 may be configured to provide the desired permeability of coating 18. For example, altering the porosity of coating 18 may increase or decrease the permeability of coating 18 to liquids, chemicals, gases, and/or solder. The alteration of the porosity of coating 18 may be a physical, chemical, and/or structural change to the polymer(s) in coating 18. In some embodiments, changing the surface energy of coating 18 may change the permeability of coating 18 to liquids, chemicals, gases, and/or solder. By controlling the relative surface energy of coating 18 to the surface energy of the penetrating liquid and/or gas, one may increase or decrease the permeability of coating 18. Controlling the permeability of coating 18 to water and/or other solvents may be especially desirable for PCBs 10 that are subjected to liquid environments (e.g., aqueous environments) and/or to solvents (e.g., during the cleaning process while manufacturing PCB 10). In some embodiments, the porosity of coating 18 may be configured such that coating 18 is selectively permeable to particular material(s) but not to other material(s). For example, coating 18 may be substantially impermeable to water while being permeable to other liquids.

In some embodiments, coating 18 may comprise multiple layers with a thin, exposed layer (e.g., upper layer) that is substantially free of pores. Thus, the exposed layer of coating 18 may be substantially impermeable to gases, moisture, and/or liquids. In such embodiments, the concealed layer(s) of coating 18 (e.g., the layer(s) between conductive tracks 16 and the exposed layer of coating 18) may comprise pores that permit the concealed layer(s) to conduct an electrical current and/or signal.

According to certain embodiments, coating 18 may exhibit a self-healing property. In some embodiments, this self-healing property may be a mechanical property that allows coating 18 to move and/or compress in response to a physical force and then, once the force subsides, to return to its original structure and/or shape. In other embodiments, this self-healing property may permit electrical self-healing of coating 18. When a physical and/or electrical force is applied to a particular area of a coated substrate 14, coating 18 on the particular area of substrate 14 may be compressed and/or otherwise altered. When the physical and/or electrical force subsides, coating 18 on the particular area may "heal" and/or otherwise reorganize to cover the particular area of substrate 14.

Coating 18 may exhibit relatively low gaseous permeability, thus providing a significant barrier to gaseous permeation and avoiding gaseous corrosion and/or oxidation through coating 18 to conductive tracks 16. In some embodiments, electrical components 12 may be selectively soldered through coating 18 without prior removal of coating 18. Solder joints 26 achieved by soldering through coating 18 may be strong in comparison to solder joints 26 associated with other currently available surface finishes. In some embodiments, coating 18 may be configured to withstand multiple heat cycles. Coating 18 may exhibit chemical resistance to corrosive gases, liquids, and/or salt solutions such as, for example, environmental pollutants. In some embodiments, coating 18 may exhibit low surface energy and/or "wettability." The materials in coating 18 and/or the method of depositing coating 18 may be configured to control the relative wettability of coating 18. Coating 18 may be a stable inert material at normal device temperatures (e.g., at temperature ranges where PCB 10 may be used). Coating 18 may exhibit good mechanical properties such as, for example, abrasion resistance and/or adhesion to PCB materials. In some embodiments, coating 18 may exhibit improved electrostatic protection. Coating 18 may have relatively low liquid and salt solution permeability, thus avoiding liquid corrosion through coating 18. According to certain embodiment, coating 18 may generally be environmentally beneficial compared to existing finishes.

Coating 18 on PCB 10 may be continuous, substantially continuous, or non-continuous over one or more surfaces of PCB 10. In some embodiments, coating 18 is continuous or substantially continuous over surfaces to be soldered and non-soldering surfaces between or adjacent to them. According to certain embodiments, coating 18 is continuous or substantially continuous over substantially all exposed and/or vulnerable surfaces of PCB 10. While a substantially continuous coating 18 may be preferred to protect PCB 10 from harmful environments, a non-continuous coating 18 may be preferred for other purposes.

In some embodiments, PCB 10 comprises one or more electrical components 12 that are affixed through coating 18 to conductive tracks 16 on substrate 14. Electrical component 12 may be any suitable circuit element of PCB 10. For example, electrical component 12 may be a resistor, transistor, diode, amplifier, oscillator, and/or any suitable element. In some embodiments, electrical component 12 comprises one or more leads configured to be affixed to a portion of conductive track 16 on substrate 14 of PCB 10. Any suitable number and/or combination of electrical components 12 may be affixed to PCB 10.

Electrical components 12 may be affixed to conductive tracks 16 on substrate 14 using any suitable technique. In some embodiments, electrical component 12 may be connected to conductive track 16 by welding, laser-enhanced welding, ultrasonic welding, and/or use of conductive adhesives. According to certain embodiments, electrical component 12 may be soldered through coating 18 to conductive track 16 on substrate 14 without the prior removal of coating 18. The solder connection between electrical component 12 and conductive track 16 may be referred to as solder joint 26. Prior to the formation of solder joint 26, coating 18 may protect conductive tracks 16 from oxidation and/or corrosion. In some embodiments, because solder joint 26 may be formed through coating 18 without the prior removal of coating 18, coating 18 may abut solder joint 26. By abutting solder joint 26, coating 18 may protect conductive tracks 16 from oxidation and/or corrosion even after electrical components 12 are soldered to PCB 10.

Solder joint 26 between electrical component 12 and conductive track 16 may be formed using leaded solder or lead-free solder. In some embodiments, soldering through coating 18 does not reduce the strength of solder joint 26, as might be expected. Indeed, in some embodiments, solder joint 26 formed by soldering through coating 18 may be stronger than a solder joint on alternative surface finishes. Solder joint 26 may be formed according to any suitable technique. In some embodiments, a flux (not illustrated) may be used to form solder joint 26. In other embodiments, a soldering process that uses heat alone (e.g., laser soldering) could be used to selectively form solder joint 26. In yet other embodiments, solder joint 26 may be formed by wave soldering, which may entail selective fluxing.

As noted above, solder joint 26 may be formed through coating 18 between electrical component 12 and conductive track 16. In this context, the phrase "formed through" may refer to the formation of solder joint 26 without the prior removal of coating 18 from conductive track 16. Thus, conductive track 16 may be coated with coating 16 and then, without first removing coating 18 from conductive track 16, one or more electrical components 12 may be soldered to conductive track 16. The soldering process may selectively alter coating 18 and may form solder joint 26 between electrical component 12 and conductive track 16. Thus, the phrase "formed through" may refer to the formation of solder joint 26 without the prior removal of coating 18 from conductive track 16.

As noted above, because solder joint 26 may be formed through coating 18 without the prior removal of coating 18, solder joint 26 may abut coating 18. In this context, the term "abutting" may refer to one or more edges of solder joint 26 directly touching, substantially touching, and/or being in substantial proximity to one or more edges of coating 18. Thus, solder joint 26 may border on the portion of coating 18 that is not selectively altered (e.g., removed) by the soldering process. In some embodiments, solder joint 26 may abut coating 18 in a single dimension or in multiple dimensions. For example, as illustrated in FIG. 1A, solder joint 26 may abut coating in the x-axis and/or y-axis direction but not in the z-axis direction.

PCB 10 comprising coating 18 may provide advantages over uncoated PCBs 10. Coating 18 may provide none, some, or all of the following advantages. One advantage is that, in some embodiments, coating 18 may protect PCB 10 from oxidizing and/or corroding while being stored. Once conductive tracks 16 are formed on substrate 14, manufacturers may store PCB 10 for variable periods of time, potentially up to several months or years, prior to attachment of electrical components 12. If left uncoated, materials in conductive tracks 16 (e.g., copper) may oxidize in air, resulting in a layer of oxide and/or tarnish forming on conductive tracks 16. Because traditional PCBs 10 lack coating 18, conductive tracks 16 on traditional PCBs 10 may oxidize and/or corrode during storage. The longer an uncoated PCB 10 is stored, the more oxidation may occur. An oxide or corrosion layer on uncoated conductive tracks 16 may hinder the formation of strong solder joints 26. In particular, the presence of an oxide or corrosion layer on conductive tracks 16 may result (i) in weak joints with low mechanical strength, (ii) in "dry joints" that have a tendency to fail during operation of the device, (iii) in a joint that fails to make electrical contact altogether, and/or (iv) in the failure of PCB 10 (e.g., failure or degradation between conductive tracks 16). In contrast, if coating 18 is applied to PCB 10, coating 18 may prevent oxidation and/or corrosion of conductive tracks 16 on PCB 10 during long-term storage (e.g., months or years), thus permitting strong solder joints 26 to be formed on conductive tracks 16 after storage. In embodiments where coating 18 is applied to metal and/or polymer based electronics, coating 18 comprising halo-hydrocarbon polymers may prevent swelling of conductors and/or devices.

Another advantage is that, in some embodiments, coating 18 comprising halo-hydrocarbon polymers may not be as expensive and/or environmentally harmful as traditional finishes. Manufacturers have applied metal finishes (e.g., tin, silver, nickel, and/or gold) to areas where soldering would be required. The processes for applying these finishes are time consuming, require additional metals to be used, and pose environmental problems. These finishes and processes may be expensive and/or pose health risks. In some cases, manufacturers have used finishes comprising organic compounds such as benzimidazoles and particles of solder-wettable metals or solder. These organic finishes, however, often do not survive multiple heat cycles and exhibit a relatively short storage life before processing. Thus, the traditional finishes used by manufacturers are generally expensive, time consuming, and/or require extra steps in the manufacturing process. The traditional finishes have also depleted nonrenewable resources such as precious metals. In contrast to the traditional finishes, coating 18 comprising a halo-hydrocarbon polymer may represent a less expensive and/or higher performance coating 18 that prevents oxidation of conductive tracks 16 prior to attaching electrical components 12 by soldering.

Another advantage is that, in some embodiments, coating 18 comprising halo-hydrocarbon polymer may prevent the formation of dendrites between solder joints 26. Dendrites of metal compounds have been observed to form in gaps between solder joints 26 on uncoated PCBs 10. Dendrites may cause short circuits and electrical leakage between connectors, resulting in failure of PCB 10. In particular, dendrites may form when moisture reaches an uncoated substrate 14 and/or conductive track 16 and generates metal ions, which are then redistributed by electromigration in the presence of an electromagnetic field. Dendrites may represent metallic growths that are caused by electromigration and form fern-like patterns along surfaces. In embodiments where coating 18 is applied prior to the formation of solder joint 26, coating may not prevent liquids from reaching solder joint 26. However, in such embodiments, coating 18 may prevent moisture from reaching substrate 14 and/or conductive tracks 16 of PCB (which is where dendrites may tend to form by ionic dissolution). Thus, coating 18 may protect PCB 10 against the formation of dendrites by (i) preventing moisture from reaching substrate 14 and/or conductive tracks 16, and/or (ii) by providing a physical barrier between conductors on PCB 10. In addition, or alternatively, because dendrite materials may have low adhesion to coating 18, coating 18 may reduce the formation of dendrites between conductive tracks 16 and/or electrical components 12 on PCB 10. In addition, or alternatively, coating 18 may prevent electrical shorting between conductive tracks 16 due to the presence of ionic species and/or metals.

Another advantage is that, in some embodiments, coating 18 may protect the environment from toxic materials in PCB 10. In order to meet standards for fire safety, PCB 10 may include elements made from flame retardant compounds (e.g., bromine-based compounds such as tetrabromobisphenol A (TBBPA)). Such compounds, however, may be toxic, may be difficult to dispose of safely, and/or may pose risks to the environment. Applying coating 18 to PCB 10 may protect the environment from such toxic materials. Applying coating 18 may eliminate or significantly reduce the need for flame retardant compounds in the base PCB laminate.

FIG. 1A illustrates PCB 10 comprising a single coating layer. In other embodiments, PCB 10 may comprise multiple coating layers. Although FIG. 1A illustrates two electrical components 12 soldered to conductive tracks 16 of PCB 10, it should be understood that PCB 10 may comprise any suitable number and/or combination of electrical components 12. Although FIG. 1A illustrates coating 18 applied to an external surface of substrate 14, it should be understood that coating 18 may be applied one or more internal surfaces of substrate 14 and/or other components of PCB 10. It should be further understood that coating 18 may be applied to PCB 10 before and/or after soldering electrical components 12 to conductive tracks 16.

Although FIG. 1A illustrates electrical components 12 soldered to conductive tracks 16, it should be understood that one or more electrical components 12 may be affixed to conductive tracks 16 by alternative bonding methods such as, for example, wire bonding. It should be further understood that the devices and components illustrated in FIGS. 1-12 are not necessarily drawn to scale.

FIG. 1B illustrates a double-sided PCB 10 that is coated with coating 18. The double-sided PCB 10 may comprise one or more layers of substrate 14. Conductive tracks 16 may be affixed to opposite sides of substrate 14. In some embodiments, conductive tracks 16 on opposite sides of substrate 14 may be communicatively coupled by one or more vias 27. Via 27 may comprise a plated hole that provides an electrical connection between conductive tracks 16 affixed to different surfaces and/or layers of PCB 10. Via 27 may be a through-hole via (e.g., via that extends through PCB), a blind via (e.g., via exposed on only one side of PCB), a buried via (e.g., via that connects internal layers of PCB without being exposed on either surface), and/or any suitable type of via. In some embodiments, coating 18 may be deposited on external and/or internal surfaces of via 27. For example, coating 18 may line the side wall of via 27 that extends through at least a portion of PCB 10. Thus, coating 18 may protect vias 27 and internal layers of PCB 10 from corrosion and/or oxidation.

Figure 1C:
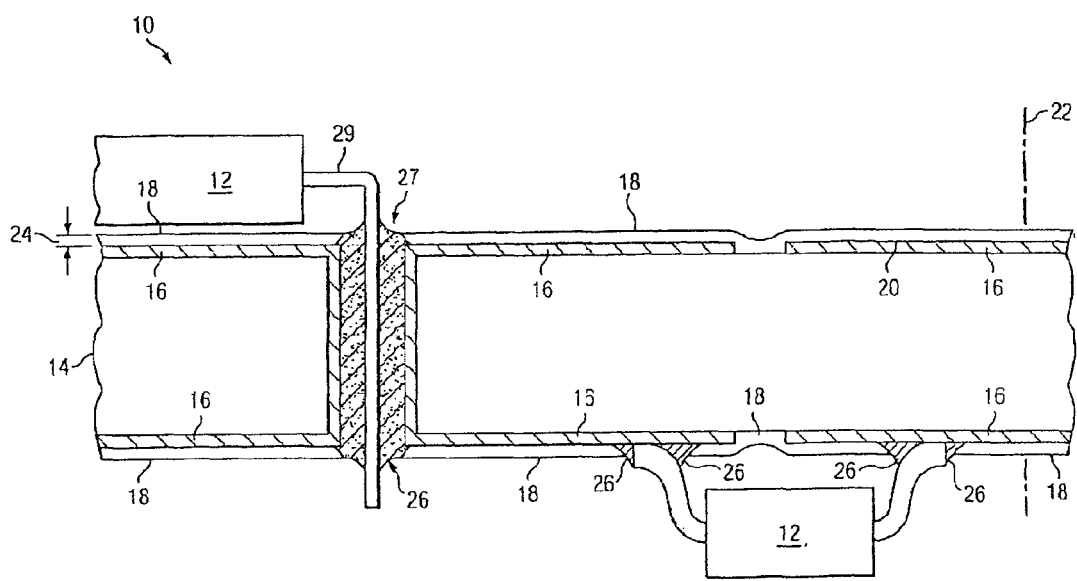

FIG. 1C illustrates electrical component 12 affixed to PCB 10 by a wave-soldering process, according to certain embodiments. As explained above, PCB 10 may comprise one or more vias 27 through substrate 14. Prior to soldering electrical components 12 to PCB 10, coating 18 may be applied to substrate 14 such that one or more coating layers coat the side-walls of via 27. After coating 18 is deposited on substrate 14, electrical component 12 may be positioned on a first side of PCB 10 such that a lead 29 of electrical component 12 extends through via 27. Thus, an end of lead 29 may protrude through the opening of via 27 on a second side (e.g., an opposite side) of PCB 10. In some embodiments, solder and/or flux may then be applied around lead 29 of electrical component 12 to form solder joint 26. According to certain embodiments, solder and/or flux is applied on the second side of PCB 10 (e.g., around the end of lead 29 protruding through the second side of PCB 10). The solder and/or flux may then flow through via 27 to form solder joint 26 between lead 29 and the side-walls of via 27 and/or conductive tracks 16 on a surface of PCB 10. Thus, solder joint 26 may extend entirely or partially through via 27. The soldering process may alter coating 18 along the side-walls of via 27. For example, in conjunction with forming solder joint 26, the soldering process may remove coating 18 from the side-walls of via 27. Although FIG. 1C illustrates one via 27 in PCB, it should be understood that PCB may comprise any suitable number of vias 27.

Figure 2:
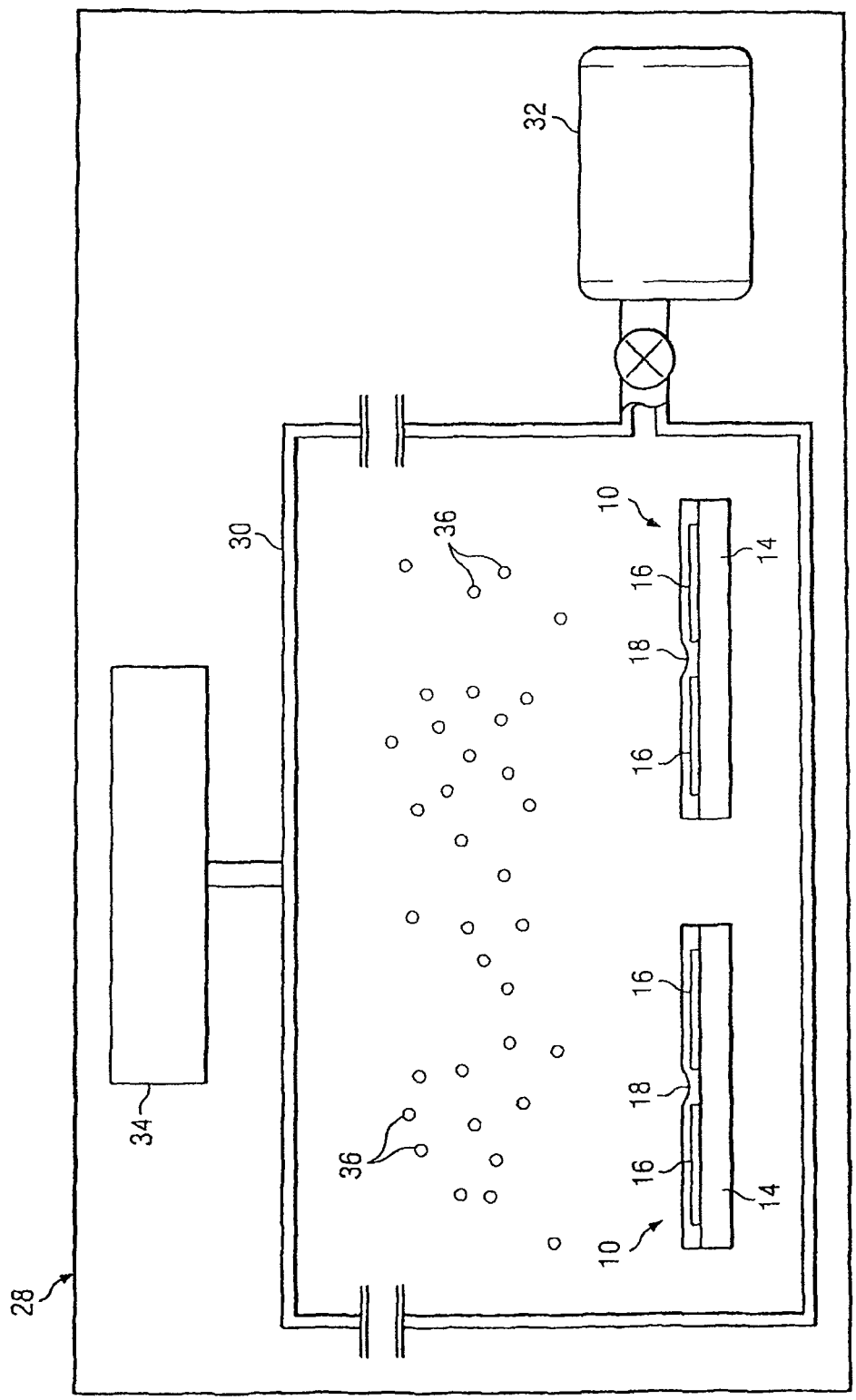
FIG. 2 illustrates the deposition of a coating on a PCB, according to certain embodiments.

FIG. 2 illustrates the deposition of coating 18 on PCB 10, according to certain embodiments. Coating 18 may be deposited on PCB 10 to protect conductive tracks 16 from oxidation and/or corrosion. In some embodiments, once conductive tracks 16 have been formed on an environmentally-exposed surface of substrate 14, coating 18 is deposited over conductive tracks 16 on substrate 14. Thus, coating 18 may be deposited on conductive tracks 16 prior to soldering any electrical components 12 to conductive tracks 16. Accordingly, coating 18 may be in direct contact with conductive tracks 16 without any solder, or essentially any solder, between coating 18 and conductive tracks 16. Coating 18 may be deposited on conductive tracks 16 according to any suitable technique. For example, coating 18 may be deposited using plasma deposition, chemical vapour deposition (CVD), molecular beam epitaxy (MBE), plasma enhanced-chemical vapour deposition (PECVD), high pressure/atmospheric plasma deposition, metallo-organic-chemical vapour deposition (MO-CVD), and/or laser enhanced-chemical vapour deposition (LE-CVD). In some embodiments, coating 18 may be deposited by a plasma deposition process that occurs at a low temperature. Such a low temperature plasma process may permit coating 18 to be used on many different types of substrates 14. In some embodiments, coating 18 may be deposited on conductive tracks 16 by the creation of inter-penetrating polymer networks (IPNs) and/or by surface absorption of monolayers (SAMs) of polymers or monomers to form in-situ polymers and/or polymer alloys. In other embodiments, coating 18 may be deposited using a liquid coating technique such as, for example, liquid dipping, spray coating, spin coating, sputtering, and/or a sol-gel process.

As illustrated in FIG. 2, coating 18 may be deposited on conductive tracks 16 by plasma deposition. Plasma deposition, which may be used in a wide range of industrial applications, is generally an effective technique for depositing thin film coatings 18. Plasma deposition may occur in a reactor 28 that generates a gas plasma comprising ionised gaseous ions, electrons, atoms, and/or neutral species. Reactor 28 may comprise a chamber 30, a vacuum system 32, and one or more energy sources 34. Reactor 28 may be any suitable type of reactor 28 configured to generate a gas plasma. Energy source 34 may be any suitable device configured to convert one or more gases to a gas plasma. For example, energy source 34 may comprise a heater, radio frequency (RF) generator, and/or microwave generator.

In some embodiments, once conductive tracks 16 are formed on substrate 14, substrate 14 may be placed in chamber 30 of reactor 28. Vacuum system 32 may pump chamber 30 down to pressures in the range of $10^{-3}$ to 10 mbar. Reactor 28 may then introduce one or more gases into chamber 30, and energy source 34 may generate and/or direct electromagnetic radiation into chamber 30 to generate a stable gas plasma. Reactor 28 may then introduce one or more precursor compounds 36 (as gases and/or liquids) into the gas plasma in chamber 30. When introduced into the gas plasma, precursor compounds 36 may be ionized and/or decomposed to generate a range of active species in the plasma that react (e.g., by a polymerization process) at a surface of PCB 10 to generate a thin coating 18.

Precursor compounds 36 may be selected to provide the desired coating properties. In some embodiments, precursor compounds 36 are hydrocarbon materials comprising halogen atoms. For example, to form coating 18 comprising a halo-hydrocarbon polymer, precursor compounds 36 may be perfluoroalkanes, perfluoroalkenes, perfluoroalkynes, fluoroalkanes, fluoroalkenes, fluoroalkynes, fluorochloroalkanes, fluorochloroalkenes, fluorochloroalkynes, and/or any suitable fluorinated and/or chlorinated organic material (e.g., fluorohydrocarbons, fluorocarbons, chlorofluorohydrocarbons, and/or chlorofluorocarbons).

In embodiments where coating 18 is deposited on PCB 10 by plasma deposition, the nature and composition of coating 18 may depend on one or more conditions such as, for example, (i) the plasma gas selected; (ii) the particular precursor compound(s) 36 used; (iii) the amount of precursor compound(s) 36 (which may be determined by the combination of the pressure of precursor compound(s) 36 and the flow rate); (iv) the ratio of precursor compound(s) 36; (v) the sequence of precursor compound(s) 36; (vi) the plasma pressure; (vii) the plasma drive frequency; (viii) the pulse width timing; (ix) the coating time; (x) the plasma power (including the peak and/or average plasma power); (xi) the chamber electrode arrangement; (xii) the preparation of the incoming PCB 10; and/or (xiii) the size and geometry of chamber 30. Plasma deposition may be used to deposit thin films from a monolayer (usually a few angstroms (Å)) to ten microns (preferably to five microns), depending on the above settings and conditions. The foregoing factors may be varied during the deposition process to build a single-layer, multi-layer, homogenous, and/or non-homogenous coating 18. In some embodiments, the plasma deposition process may only impact the exposed surface (e.g., the surface affixed to conductive tracks 16) of PCB 10. Thus, the plasma deposition techniques may be fully compatible with the manufacture of PCB 10, causing little or no damage or other unwanted effects to PCB 10. In some embodiments, plasma deposition techniques do not expose PCB 10 to the relatively high temperatures associated with alternative surface finish processes.

In some embodiments, one advantage of plasma deposition may be that coating 18 is deposited such that it accesses all surfaces of PCB 10. As a result, vertical surfaces of PCB 10 (e.g., surfaces only accessible through holes in PCB 10) and/or overhanging structures on PCB 10 may be covered with coating 18. Consequently, coating 18 may protect PCB 10 from oxidation and/or corrosion along any sides, edges, points, and/or areas at which conductive tracks 16 contact substrate 14 of PCB 10. In some embodiments, the plasma deposition process is not limited by the surface tension constraints that limit the wet chemistry used in other surface finish processes. Consequently, smaller vias and/or other holes may be coated.

In some embodiments, reactor 28 may use an active gas plasma to perform in-situ cleaning of the exposed surface(s) of PCB 10 prior to plasma deposition. In such embodiments, prior to introducing precursor compounds 36 into chamber 30 for the plasma deposition stage, reactor 28 may introduce an active gas plasma into the same chamber 30 to clean substrate 14 and/or conductive tracks 16 of PCB 10. The active gas plasma may be based on a stable gas such as, for example, a rare gas, a hydrocarbon gas, and/or a halogenated hydrocarbon gas. In some embodiments, the active gas plasma may be based on hydrogen, oxygen, nitrogen, argon, methane, ethane, tetrafluoromethane ($CF_4$), hexafluoroethane ($C_2F_6$), tetrachloromethane ($CCl_4$), other fluorinated or chlorinated hydrocarbons, and/or a mixture thereof. According to certain embodiments, PCB 10 may be cleaned in chamber 30 by the same material to be deposited on PCB 10. For example, a fluorinated or chlorinated hydrocarbon such as, for example, tetrafluoromethane ($CF_4$), hexafluoroethane ($C_2F_6$), hexafluoropropylene ($C_3F_6$), and/or octafluoropropane ($C_3F_8$) may be used both to clean the surface(s) of PCB 10 and to lay down a layer of a halo-hydrocarbon polymer and/or a layer of metal halide (e.g., metal fluoride, metal chloride, etc.) on substrate 14.

In some embodiments, where a layer of coating 18 comprising a halogen or halide-based material is applied directly to conductive track 16 of PCB 10, a very thin layer (e.g., five nm or less) of metal halide may form on an exposed surface of conductive track 16. In some embodiments, the metal halide is a metal fluoride such as, for example, copper fluoride or a derivative thereof. The metal halide layer may be robust, may be inert, and/or may prevent the formation on conductive tracks 16 of oxide layers and/or tarnishes that could prevent effective soldering.

In some circumstances, however, a metal halide layer on PCB 10 may be undesirable if it results, for example, in intermetallics that are vulnerable to weakening under specific environmental conditions. In such cases, depositing a first coating layer comprising a non-halo-hydrocarbon material (e.g., polythene and/or polypropylene) on PCB 10 may prevent the formation of a metal halide layer when a second coating layer comprising a halo-hydrocarbon polymer is deposited.

Although FIG. 2 illustrates a single PCB 10 in chamber 30 in reactor 28, it should be understood that any number of PCBs 10 may be simultaneously placed in chamber 30 and coated with coating 18. Although FIG. 2 illustrates the formation of coating 18 on PCB 10 by plasma deposition, it should be understood that coating 18 may be deposited on PCB 10 using any suitable technique.

As explained above, once coating 18 is deposited over conductive tracks 16 on substrate 14, electrical components 12 may be affixed through coating 18 to conductive tracks 16. Electrical components 12 may be affixed to conductive tracks 16 using any suitable technique such as, for example, soldering, wire bonding, electrostatic bonding, and/or Van der Waals bonding. In some embodiments, electrical components 12 may be connected to conductive tracks 16 by using an adhesive on coating 18 (thereby making use of the z-axis conductivity of coating 18).

Figure 3B:
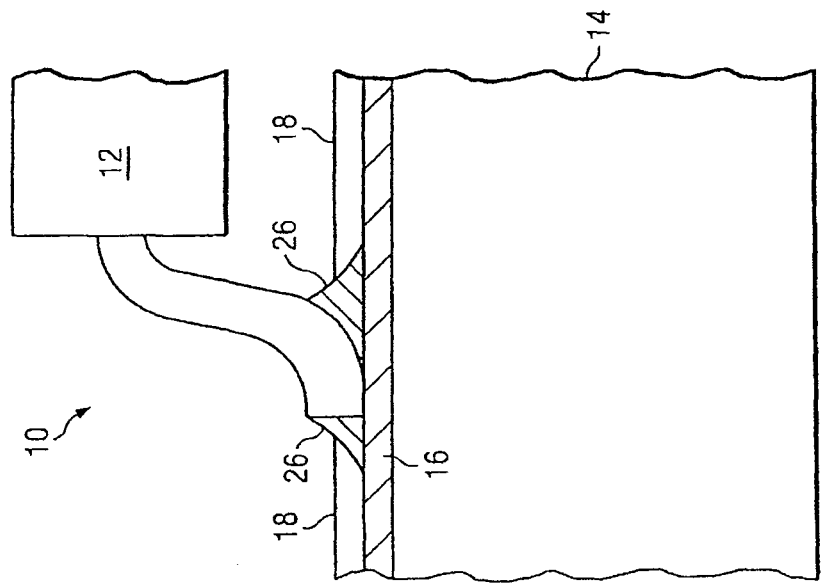
FIGS. 3A-B illustrate the soldering of an electrical component to conductive tracks of PCB, according to certain embodiments.
Figure 3A:
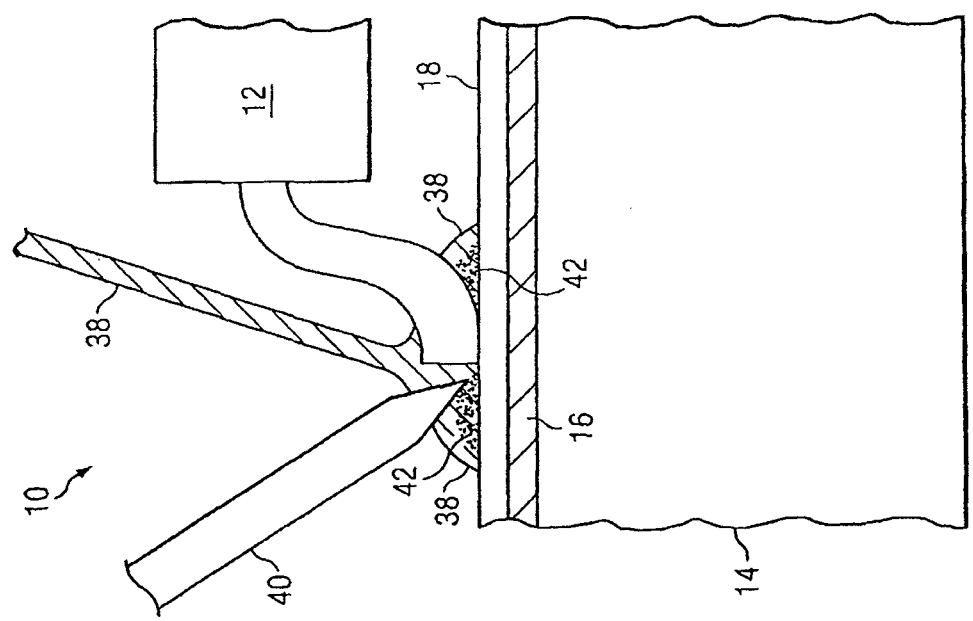

FIGS. 3A-B illustrate the soldering of electrical component 12 to conductive track 16 of PCB 10, according to certain embodiments. As illustrated in FIG. 3A, electrical component 12 may be soldered through coating 18 without first removing coating 18 from conductive track 16. The soldering process may comprise applying heat and solder 38 to a particular area of PCB 10 where solder joint 26 is to be formed. Heat may be applied to solder 38 using any suitable heat source such as, for example, a soldering iron 40. In some embodiments, the soldering process may also comprise applying flux 42 to the particular area of PCB 10. The heat, flux 42, and/or solder 38 may selectively alter coating 18 at the particular area of PCB 10. In some embodiments, altering coating 18 may refer to removing coating 18 from the particular area of PCB 10. Coating 18 may be removed by applying solder 38, and optionally flux 42, to PCB 10 at a temperature and for a time such that solder 38 bonds to conductive track 16 and coating 18 is locally dispersed, absorbed, vaporised, dissolved, and/or degraded. In some embodiments, altering coating 18 may comprise changing the structure, porosity, and/or surface energy of coating 18. For example, fluxing may alter the surface energy of pores in coating 18, which may change the wettability of coating 18 such that solder 38 can flow through pores in coating 18 to conductive track 16. Thus, in this example, solder joint 26 may form an electrical connection through coating between electrical component 12 and conductive track 16. As another example, the soldering process may selectively alter coating 18 by inducing voids (e.g., cracks) and/or causing voids to propagate in the particular area of coating 18 where solder 38 and/or flux 42 is applied. Preferably, one or more factors are configured so that the soldering process achieves good solder flow, covers a portion of conductive track 16 on substrate 14 with solder 38, and/or forms a strong solder joint 26. These factors may include: (i) the characteristics of substrate 14, (ii) the characteristics of coating 18, (iii) the solder/flux characteristics, (iv) the soldering profile (including time and temperature), (v) the process to disperse coating 18, and (vi) the process to control solder flow around solder joint 26.

In some embodiments, the action of flux 42 and temperature alone may interact with the halo-hydrocarbon polymers in coating 18 to alter coating 18 locally at the particular area of PCB 10 to which flux 42 is applied. According to certain embodiments, altering coating 18 at the particular area of PCB 10 may comprise removing coating 18 from the particular area of PCB 10. Solder 38 and/or flux 42 may be heated to any suitable temperature depending at least in part on the composition of solder 38. In some embodiments, solder 38 and/or flux 42 are heated to between 200° C. and 300° C. According to certain embodiments, solder 38 and/or flux 42 are heated to between 240° C. and 280° C. In a preferred embodiment using lead-free solder 38, solder 38 and/or flux 42 are heated to approximately 260° C.

The action of flux 42 and/or temperature may locally disperse, absorb, vaporise, dissolve, and/or degrade coating 18 comprising halo-hydrocarbon polymer. Thus, coating 18 may only be altered at (e.g., removed from) the particular area of PCB 10 where solder 38 and/or flux 42 is applied. As illustrated in FIG. 3B, coating 18 may remain attached to the surface of PCB 10 right up until solder joint 26. By abutting solder joint 26, coating 18 may provide environmental protection of conductive tracks 16 of PCB 10 right up to solder joint 26.

According to certain embodiments, there may be a balance between the time required to alter coating 18, the temperature required to alter coating 18, and/or the acidity or aggressiveness of flux 42. Thus, milder fluxes 42 may suffice if higher temperatures are used, and vice versa. In some embodiments, a metal halide layer (e.g., copper fluoride) may reside between conductive track 16 and a halo-hydrocarbon layer in coating 18. The metal halide layer may exhibit a self fluxing action when heat is applied to a particular area of PCB 10. The soldering process may take advantage of this self fluxing property. In some embodiments, the metal halide layer and/or the decomposition of halo-hydrocarbon polymers in coating 18 may release fluorine and/or hydrogen fluoride (HF) to initiate fluxing (self fluxing) during the soldering process. Due to this self fluxing property, if a sufficiently high temperature is used during the soldering process, solder joint 26 may be formed without using any flux 42.

Any suitable solder 38 may be used to form solder joint 26. In some embodiments, solder 38 may be a fusible metal alloy having a melting point in the range of 90° C. to 450° C. In some embodiments, solder 38 is a tin/lead solder 38 such as, for example, 60/40 Sn/Pb or 63/37 Sn/Pb. In other embodiments, solder 38 is a lead-free solder 38 such as, for example, an alloy comprising tin, copper, silver, bismuth, indium, zinc, and/or antimony. Examples of lead-free solder 38 include SnCu0.7, SnAg3.5Cu0.7, and SnAg3.0Cu0.5. In some embodiments, solder 38 may comprise a powdered metal that is suspended in flux 42. The mixture of the powdered metal and flux 42 may be referred to as a solder paste.

In embodiments using flux 42 to form solder joint 26, any suitable flux 42 may be used. In some embodiments, flux 42 may be a mild flux 42 such as, for example, a "no-clean" flux (e.g., a rosin flux) that does not require a subsequent step of cleaning PCB 10. In other embodiments, flux 42 may be an organic flux 42 such as, for example, an organic acid (e.g., lactic acid, acrylic acid, etc.), an organic salt (e.g., dimethylammonium chloride (DMA HCl)), and/or an organic amine (e.g., urea). In yet other embodiments, flux 42 may be a resin/rosin flux 42 such as, for example, a synthetic resin or a natural rosin. In yet other embodiments, flux 42 may be an inorganic flux 42 such as, for example, an inorganic salt (e.g., zinc chloride, sodium chloride, potassium chloride, sodium fluoride, etc.) and/or an inorganic acid (e.g., hydrochloric acid, nitric acid, etc.). In yet other embodiments, flux 42 may be a halide free flux, a no-residue flux, and/or a low solids flux. In addition, or alternatively, industrial fluxes 42 may be used, such as, for example, fluxes 42 used for general soldering, brazing, welding, cleaning, or etching a metal surface. An example of such an industrial flux 42 is borax. The choice of flux 42 may depend on the nature of coating 18, especially the particular thickness 24 and composition of coating 18. A thicker, more resistive coating 18 may require using a more aggressive flux 42. In addition, or alternatively, the choice of flux 42 may depend on the wetting properties of the materials in coating 18. A composition that comprises the active ingredient or ingredients of flux 42 and that selectively alters coating 18 on PCB 10 (e.g., selectively removes coating 18) may be used in place of flux 42.

As explained above, coating 18 permits the formation of good solder joints 26 on conductive tracks 16 of PCB 10. One or more factors may be controlled to achieve good quality, strong solder joints 26 on PCB 10. These factors may include: (i) the wetting characteristics and/or surface energy of the coated substrate 14 and/or PCB 10; (ii) the surface roughness of the coated substrate 14 and/or PCB 10; (iii) the surface roughness of conductive tracks 16 on substrate 14; (iv) the composition of solder 38 and/or solder paste (including active agents and/or solvents); (v) the temperature profile of the soldering process, which may include optimizing profile temperatures and residence times to improve wetting performance of solder 38, solder paste, and/or active components;

(vi) the size and/or geometry of conductive tracks 16 on the coated substrate 14; and/or (vii) the particle size of components present in solder 38 and/or solder paste. In some embodiments, the strength and/or quality of solder joint 26 may be enhanced by the pre-treatment, cleanliness, and/or surface preparation of conductive tracks 16 on substrate 14. Conductive tracks 16 may be cleaned by a surface treatment of plasma gas, sulphuric acid, and/or hydrogen peroxide and/or by a persulphate-based etchant process. According to certain embodiments, the aperture size and/or thicknesses of the solder paste stencil may be configured to control the quantity, position, wetting, and/or spread of the solder paste dispensed on conductive tracks 16 on the coated substrate 14.

In some embodiments, the quality and/or strength of solder joint 26 may be enhanced by balancing the viscosity and surface tension of the solder paste with temperature to (i) control the wetting and flow of the solder paste on conductive tracks 16 and/or (ii) control the capillary action caused by electronic components on conductive tracks 16. This capillary action may tend to displace the solder paste from its desired location, especially if Fine Pitch and/or Ball Grid Array (BGA) soldering is used. According to certain embodiments, the quality and/or strength of solder joint 26 may be enhanced by controlling the composition, chemical stability, and/or thickness 24 of coating 18 such that the solder paste selectively alters coating 18 on a particular area on the surface of substrate 14. In some embodiments, the quality and/or strength of solder joint 26 may be enhanced by controlling the chemical action of the active component in the solder paste with the halo-hydrocarbon polymers in coating 18 to facilitate the selective alteration (e.g., selective removal) of coating 18. The quantity and/or composition of the active components in the solder paste may be optimised to facilitate this action.

Although FIGS. 3A-B illustrate a soldering process that uses solder 38, heat, and flux 42 to form solder joint 26, it should be understood that solder joint 26 may be formed through coating 18 using solder 38 and heat without any flux 42. Although FIGS. 3A-B illustrate solder joint 26 formed through a single-layer coating 18, it should be understood that solder joint 26 may be formed through a multi-layer coating 18.

Figure 4:
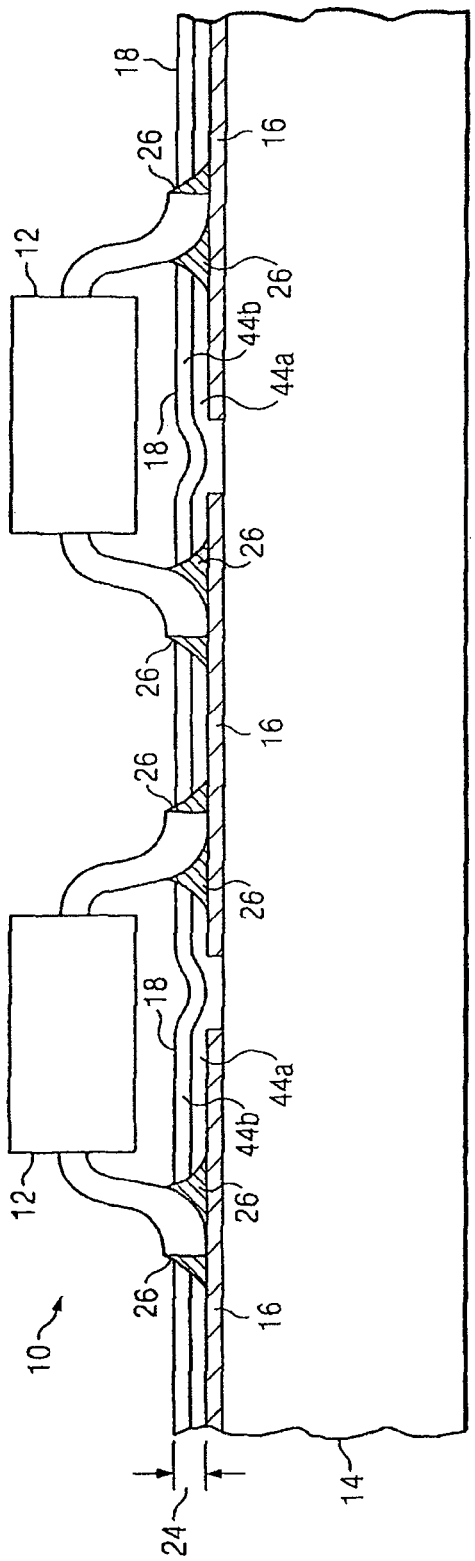
FIG. 4 illustrates a PCB comprising a multi-layer coating, according to certain embodiments.

FIG. 4 illustrates PCB 10 comprising a multi-layer coating 18, according to certain embodiments. The term "multi-layer" may refer to coating 18 that comprises two or more distinct and/or graded layers 44 of polymers. Where a multi-layer coating 18 comprises distinct layers 44, each layer 44 may comprise a discrete chemical composition. Where a multi-layer coating 18 comprises graded layers 44, individual layers 44 may form a region of intermediate composition between the individual layers 44. The material(s) in the region of intermediate composition may have varying molecular weight, chemical composition, structure, geometry, porosity, and/or other properties. Thus, multi-layer coating 18 may comprise multiple distinct layers 44 of polymers and/or may comprise multiple graded layers 44 of polymers.

In some embodiments, the multi-layer coating 18 may comprise a first layer 44a comprising a first type of polymer and a second layer 44b comprising a second type of polymer. In other embodiments, the first layer 44a and second layer 44b of the multi-layer coating 18 may comprise polymers that have a similar chemical composition but different structures, different degrees of conjugation, and/or different weights. In some embodiments, a particular layer 44 in the multi-layer coating 18 may comprise a single type of halo-hydrocarbon polymer. In other embodiments, a particular layer 44 in the multi-layer coating 18 may comprise a mixture of different types of halo-hydrocarbon polymers. According to certain embodiments, each layer 44 in the multi-layer coating 18 may comprise the same or different compositions of polymer(s). In some embodiments, each layer 44 comprises similar precursor compounds 36 that are processed differently to form each layer 44. This may result in each layer 44 having different polymers, different polymer networks, different molecular weights, different sizes, different physical structures, and/or differences in other properties. In other embodiments, each layer 44 comprises different precursor compounds 36, which may cause each layer to comprise different materials and/or material properties.

The multi-layer coating 18 on PCB 10 may comprise any suitable number of layers 44. In some embodiments, the multi-layer coating 18 comprises from two to five layers 44. In other embodiments, the multi-layer coating 18 comprises from two to four layers 44. In a preferred embodiment, the multi-layer coating 18 comprises two or three layers 44. In embodiments where coating 18 comprises three or more layers 44, the multi-layer coating 18 may be configured such that two or more layers 44 that are not adjacent to each other comprise the same polymer. For some applications, the number of layers 44 in the multi-layer coating 18 may be selected to enhance the anti-reflective and/or dielectric properties of the multi-layer coating 18. In such embodiments, the multi-layer coating 18 may comprise a higher number of layers 44 (e.g., four or more) with the thickness and/or geometry of each layer 44 being controlled. In such embodiments, a particular layer 44 in the multi-layer coating 18 may be chiral such that the particular layer 44 is ordered through orientation and/or chemical structure.

A multi-layer coating 18 on PCB 10 may have any suitable thickness 24. For example, a multi-layer coating 18 may have an overall thickness 24 from one nm to ten μm, from one nm to five hundred nm, from three nm to five hundred nm, from ten nm to five hundred nm, from ten nm to two hundred and fifty nm, or from ten nm to thirty nm. In a preferred embodiment, a multi-layer coating 18 on PCB 10 has an overall thickness 24 from ten nm to one hundred nm, with one hundred nm being a preferred thickness 24.

The respective layers 44 within a multi-layer coating 18 may have any suitable thickness. In some embodiments, the ratio of thicknesses of each layer 44 may be varied to achieve different properties of coating 18. In some embodiments, each layer 44 within coating 18 on PCB 10 may be of equal or approximately equal thickness. In other embodiments, one layer 44 may be thicker than other layer(s) 44 so that a multi-layer coating 18 exhibits overall properties that are tuned to provide the combined functionality derived from contributions from each layer 44 within coating 18. According to certain embodiments, the thickness of a particular layer 44 may comprise sixty to ninety percent of the overall thickness 24 of a multi-layer coating 18, and the combined thickness of the remaining layer(s) 44 may comprise ten to forty percent of the overall thickness 24 of the multi-layer coating 18.

In embodiments where coating 18 comprises multiple graded layers 44, the proportions of the respective polymers in the graded layers 44 may be varied to achieve different properties of the overall coating 18. Where coating 18 comprises multiple graded layers 44, adjacent layers 44 may be fused together such that polymers of intermediate chemical composition are present between adjacent layers 44. In addition, or alternatively, a multi-layer coating 18 may comprise one or more polymer layers 44 adjacent to a layer 44 of metal halide (e.g., metal fluoride). According to certain embodiments, the proportion of each polymer in a graded, multilayer coating 18 may be equal. In other embodiments of coating 18 comprising graded layers 44 of different polymers, coating 18 may comprise more of a particular polymer than other polymer(s) such that the multi-layer coating 18 more highly exhibits the properties of the particular polymer. In such embodiments, the particular polymer may make up sixty to ninety percent of coating 18 such that the remaining polymer(s) make up ten to forty percent of coating 18. As noted above, the interface between layers 44 may be well defined in some embodiments, and in other embodiments, the interface between layers 44 may be graded.

According to certain embodiments, the first layer 44a of the multi-layer coating 18 (i.e., the particular layer 44 abutting substrate 14 and/or conductive tracks 16) is continuous or substantially continuous. In such embodiments, none or substantially none of the second layer 44b may come into contact with substrate 14 and/or conductive tracks 16 of PCB 10. One or more layers 44 of the multi-layer coating 18 may be deposited on substrate 14 and/or conductive tracks 16 prior to the soldering of any electrical components 12 to conductive tracks 16 on substrate 14. Accordingly, there may be no solder 38, or essentially no solder 38, between one or more layers 44 of the multi-layer coating 18 and conductive tracks 16.

As explained above, electrical components 12 may be connected to conductive tracks 16 by various methods such as, for example, soldering and or wire bonding. In some embodiments, at least one layer 44 of a multi-layer coating 18 may be optimized for wire bonding and another layer of the multi-layer coating 18 may be optimized for soldering. For example, a first layer 44 that is optimized for wire bonding may be first deposited on conductive tracks 16. The wire bonding process may then be executed to connect at least one electrical component 12 to conductive track 16. A second layer 44 of the multi-layer coating 18 may then be deposited over PCB 10. The second layer 44 may be optimized for soldering. Another electrical component 12 may then be soldered through the multi-layer coating 18 to conductive track 16. Alternatively, the foregoing steps could be reversed such that the particular layer 44 that is optimized for soldering could be deposited, then the soldering could be performed, then the particular layer 44 that is optimized for wire bonding could be deposited, and then the wire bonding could be performed.

In some embodiments, coating 18 comprises at least one layer 44 comprising a low-halogen-containing hydrocarbon polymer. A low-halogen-containing hydrocarbon polymer may be any suitable polymer having less than a threshold quantity of halogen atoms. For example, a low-halogen-containing hydrocarbon polymer may refer to a polymer having less than a configurable percentage (by mass) of halogen atoms (e.g., less than two percent by mass, less than 0.5 percent by mass, and/or any suitable percentage).

According to certain embodiments, coating 18 comprises at least one layer 44 comprising a halo-hydrocarbon polymer and another layer 44 comprising a non-halo-hydrocarbon polymer. In some embodiments, a non-halo-hydrocarbon polymer may be any suitable polymer that does not comprise halogen atoms. A non-halo-hydrocarbon polymer may have a straight or branched chain or ring carbon structure. In some embodiments, there may be crosslinking between the chains of a non-halo-hydrocarbon polymer. A non-halo-hydrocarbon polymer may comprise one or more unsaturated groups such as, for example, carbon-carbon double and/or triple bonds. In some embodiments, a non-halo-hydrocarbon polymer comprises one or more heteroatoms (i.e., atoms that are not carbon, hydrogen, or a halogen) such as, for example, nitrogen, sulphur, silicon, and/or oxygen. According to certain embodiments, the molecular weight of a non-halo-hydrocarbon polymer is greater than five hundred amu. A non-halo-hydrocarbon polymer may be a polymer that can be deposited by plasma deposition.

A particular layer 44 of coating 18 may comprise any suitable non-halo-hydrocarbon polymer(s). For example, the particular layer 44 may comprise a polyalkene, a polyester, a vinyl polymer, a phenolic resin, and/or a polyanhydride. In a preferred embodiment, the particular layer 44 comprises a polyalkene such as, for example, polythene and/or polypropylene.

In some embodiments, PCB 10 may comprise coating 18 comprising (i) a first layer 44a of a non-halo-hydrocarbon polymer that is deposited directly on substrate 14 and/or conductive tracks 16 and (ii) a second layer 44b of a halo-hydrocarbon polymer that is deposited on the first layer 44a. Such embodiments may be advantageous where a metal halide layer 44 on conductive tracks 16 is not desirable. In particular, depositing a first layer 44a of a non-halo-hydrocarbon polymer directly on conductive tracks 16 may prevent the formation of a metal halide layer 44 on conductive tracks 16. In some embodiments, a metal halide layer 44 may be undesirable if it results, for example, in intermetallics that are vulnerable to weakening under specific environmental conditions. In such embodiments, a first layer 44a comprising a non-halo-hydrocarbon polymer may serve as a barrier between conductive tracks 16 and a second layer 44b comprising a halo-hydrocarbon polymer. Thus, the formation of a first layer 44a comprising a non-halo-hydrocarbon polymer may prevent the formation of a metal halide layer 44 during subsequent deposition of a layer 44 comprising a halo-hydrocarbon polymer.

In other embodiments, a metal halide layer may be desired. In such embodiments, coating 18 may comprise (i) a first layer 44a of a metal halide that is formed directly on substrate 14 and/or conductive tracks 16 and (ii) a second layer 44b of a halo-hydrocarbon polymer that is deposited on the first layer 44a.

Although one or more embodiment described above comprise a first layer 44a of a non-halo-hydrocarbon polymer and a second layer 44b of a halo-hydrocarbon polymer, it should be understood that, in other embodiments, all, some, or none of the layers 44 of a multi-layer coating 18 may comprise a halo-hydrocarbon polymer. It should be further understood that all, some, or none of the layers 44 of the multi-layer coating 18 may comprise a non-halo-hydrocarbon polymer.

A multi-layer coating 18 on PCB 10 may be configured to offer varying and/or customized performance. In some embodiments, layers 44 of a multi-layer coating 18 may be configured to optimize the conductivity, oxidation resistance, environmental protection, cost, moisture absorption/resistance, dendrite prevention, flame retardancy, and/or other optical, electrical, physical, and/or chemical properties of the multi-layer coating 18. For example, a relatively thick coating 18 that is highly fluorinated may be desirable to provide good environmental protection in certain embodiments, while in other embodiments, a relatively thin coating 18 comprising less halide may be preferred. As described above with respect to FIGS. 3A-B, electrical components 12 may be soldered through a multi-layer coating 18 to conductive tracks 16 without first removing the multi-layer coating 18.

According to certain embodiments, a multi-layer coating 18 on PCB 10 comprises a first layer 44a comprising a first type of halo-hydrocarbon polymer and a second layer 44b comprising a second type of halo-hydrocarbon polymer. In some embodiments, a multi-layer coating 18 comprises a particular layer 44 of a polytetrafluoroethylene (PTFE) type material and another layer 44 of a polychlorotrifluoroethylene (PCTFE) type material. The PCTFE layer 44 may be deposited directly on substrate 14 and/or conductive tracks 16 and the PTFE layer 44 may be deposited on the PCTFE layer 44. In such embodiments, the PCTFE layer 44 may prevent oxidation of conductive tracks 16 and the PTFE layer 44 may provide environmental protection for PCB 10. In other embodiments, the PTFE layer 44 may be deposited directly on substrate 14 and/or conductive tracks 16 and the PCTFE layer 44 may be deposited on the PTFE layer 44. This may allow the external physical and/or chemical properties of the surface of PCB 10 to be determined by the PCTFE layer 44.

Although FIG. 4 illustrates a multi-layer coating 18 having distinct layers, it should be understood that the multi-layer coating 18 may have graded layers. Although a PTFE layer 44 and a PCTFE layer 44 of a multi-layer coating 18 are described above, it should be understood that the multi-layer coating 18 may comprise any suitable types and/or combinations of materials. In some embodiments, the material(s) in the multi-layer coating 18 may not be PTFE type and/or PCTFE type materials.

Figure 5:
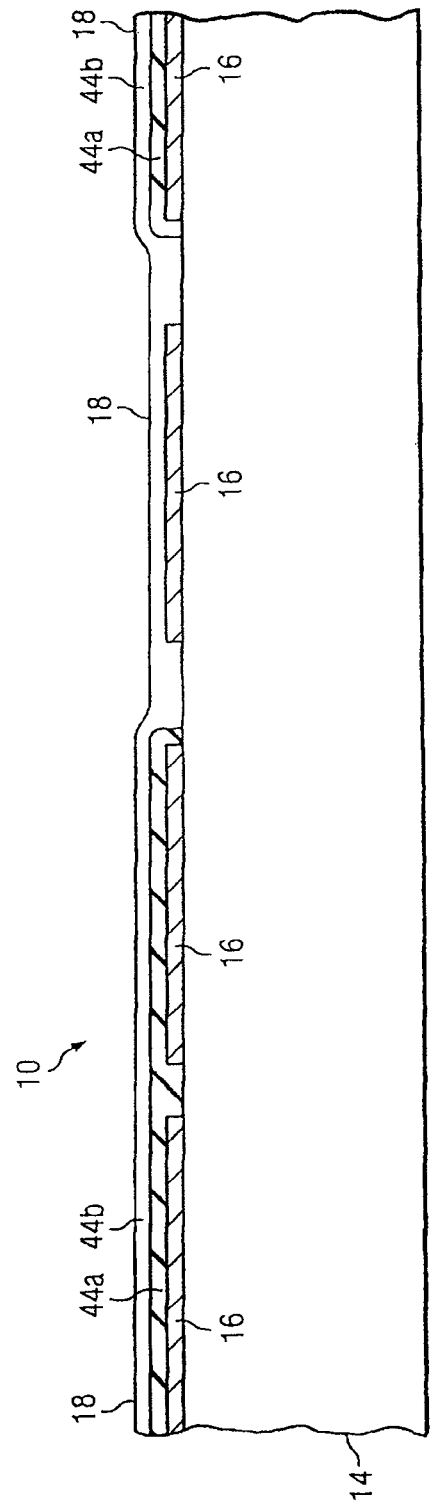
FIG. 5 illustrates a PCB comprising a multi-layer coating selectively applied to particular regions of the PCB, according to certain embodiments.

FIG. 5 illustrates PCB 10 comprising a multi-layer coating 18 selectively applied to particular regions of PCB 10, according to certain embodiments. As illustrated, particular regions of PCB 10 may be coating 18 with a single-layer coating 18 and other regions of PCB 10 may be coated with a multi-layer coating 18. Thus, different regions of PCB 10 may be coated with different polymers, or mixtures thereof, to achieve different properties in the different regions. For example, in a first region of PCB 10 it may be desirable to have a multi-layer coating 18 that exhibits piezo-electric and/or electroresistive properties, while in a second region of PCB 10 it may be desirable to have a single-layer coating 18 that exhibits electrically insulating properties. In this example, one may apply to the first region of PCB 10 a multi-layer coating 18 having a first layer 44a comprising a polymer of vinylidenefluoride (PVDF) and a second layer 44b comprising another halo-hydrocarbon polymer. Layer 44 of PVDF may enhance the piezo-electric, electroresistive, and/or electrostrictive properties of coating 18 in the first region of PCB 10. In this example, one may apply to the second region of PCB 10 a single-layer coating 18 comprising a halo-hydrocarbon polymer or a non-halo-hydrocarbon polymer that exhibits greater insulation properties that PVDF. Thus, particular regions of PCB 10 may be coated with a single-layer coating 18 and other regions of PCB 10 may be coated with a multi-layer coating 18.

Although the foregoing example illustrates coating 18 comprising PVDF, it should be understood that any suitable polymers may be used in any single-layer and/or multi-layer coating 18.

A multi-layer coating 18 may be applied to PCB 10 using any suitable technique. For example, a multi-layer coating 18 may be deposited using plasma deposition, chemical vapour deposition (CYD), molecular beam epitaxy (MBE), plasma enhanced-chemical vapour deposition (PE-CYD), high pressure/atmospheric plasma deposition, metallo-organic-chemical vapour deposition (MO-CYD), and/or laser enhanced-chemical vapour deposition (LE-CVD). In some embodiments, a multi-layer coating 18 may be deposited by the creation of inter-penetrating polymer networks (IPNs) and/or by surface absorption of monolayers (SAMs) of polymers or monomers to form in-situ polymers and/or polymer alloys. In other embodiments, a multi-layer coating 18 may be deposited using a liquid coating technique such as, for example, liquid dipping, spray coating, spin coating, sputtering, and/or a sol-gel process. In embodiments comprising multi-layer coatings 18, each layer 44 may be formed using the same or different techniques.

In some embodiments, a multi-layer coating 18 is applied to PCB 10 using the plasma deposition technique described above with respect to FIG. 2. In such embodiments, once conductive tracks 16 are formed on substrate 14, substrate 14 may be placed in chamber 30 in reactor 28. Reactor 28 may introduce gases (e.g., hydrogen, argon, and/or nitrogen) into chamber 30 to clean substrate 14. Reactor 28 may then introduce one or more precursor compounds 36 into chamber 30 to form a multi-layer coating 18 on substrate 14 by plasma deposition. In some embodiments, the multi-layer coating 18 may follow the three dimensional form of substrate 14 and/or conductive tracks 16 of PCB 10.

A multi-layer coating 18 (comprising either distinct or graded layers 44) may be deposited on substrate 14 by varying the composition of precursor compounds 36 introduced into chamber 30. In some embodiments, one or more precursor compounds 36 may be used to generate a gas mixture in chamber 30. The mixture of precursor compounds 36 may be configured to generate graded layers 44 of coating 18 on substrate 14. In other embodiments, distinct layers 44 of coating 18 may be deposited on substrate 14 by switching between precursor compounds 36 and modifying conditions in chamber 30. The composition of a multi-layer coating 18 may be controlled by one or more of the following factors: (i) the plasma gas selected; (ii) the particular precursor compound(s) 36 used; (iii) the amount of precursor compound(s) 36 (which may be determined by the combination of the pressure of precursor compound(s) 36 and flow rate); (iv) the ratio of precursor compound(s) 36; (v) the sequence of precursor compound(s) 36; (vi) the plasma pressure; (vii) the plasma drive frequency; (viii) the pulse width timing; (ix) the coating time; (x) the plasma power (including the peak and/or average plasma power); (xi) the chamber electrode arrangement; (xii) the preparation of the incoming PCB 10; and/or (xiii) the size and geometry of chamber 30. Coating 18 deposited by plasma deposition may completely, or substantially completely, encapsulate all surfaces of PCB 10. As a result, coating 18 may stop or reduce aqueous absorption and "wetting" of PCB 10. This may significantly reduce any corrosive action from within substrate 14 and/or from under or adjacent to conductive tracks 16. This may be especially advantageous for epoxy-based PCBs 10 and paper/card PCBs 10, which may tend to absorb water, aqueous acids, and/or corrosive materials and which may be vulnerable to corrosion by such in-situ mechanisms.

Plasma deposition may be used to deposit layer(s) 44 of halo-hydrocarbon polymers and/or layer(s) 44 of non-halo-hydrocarbon polymers. Precursor compounds 36 for halo-hydrocarbon polymers are described above with respect to FIG. 2. With respect to non-halo-hydrocarbon polymers, precursor compounds 36 may be hydrocarbon materials that are selected to provide the desired coating 18 properties. When introduced into the gas plasma, the particular precursor compounds 36 may be ionized/decomposed to generate a range of active species that will react at the surface of PCB 10 (e.g., by a polymerisation process) to generate a thin layer 44 of a non-halo-hydrocarbon polymer. Any suitable precursor compounds 36 may be used to form a non-halo-hydrocarbon layer 44. Examples of precursor compounds 36 for depositing layer 44 of a non-halo-hydrocarbon polymer are alkanes, alkenes, and alkynes.

As explained above, PCB 10 may be coated with complex, three-dimensional coatings 18. Such coatings 18 may comprise a single layer 44 over particular regions of PCB 10 and multiple layers 44 over other regions of PCB 10. Any suitable techniques may be used to form such coatings 18. In some embodiments, one or more layers 44 of coating 18 may be deposited only on selective areas of PCB 10. For example, one or more layers 44 of coating 18 may be selectively deposited (i) by masking the surface of PCB 10 to deposit coating 18 only in non-masked areas, (ii) by using photo-assisted plasma deposition techniques (e.g., laser or UV light assisted), and/or (iii) by using metallo-organic chemical vapour deposition (MOCVD) type precursor compounds 36 such as, for example, metal-alkyl and/or carbonyl precursors. In other embodiments, coatings 18 may be formed using one or more subtractive techniques.

According to certain embodiments, the deposition process may be configured to modify the wetting characteristics of coating 18 on PCB 10. Wetting may refer to (i) the wetting of the surface of the coated PCB 10 by liquids such as water, (ii) the wetting of coating 18 by solder 38 and/or flux 42 during the soldering process, and/or (iii) the wetting of conductive tracks 16 by solder 38 after coating 18 has been altered (e.g., locally removed). The wetting characteristics of coating 18 may be modified according to any suitable technique. For example, the wetting characteristics of coating 18 may be modified by plasma etching using reactive gas plasmas such as, for example, carbon tetrafluoride ($CF_4$). As another example, the wetting characteristics of coating 18 may be modified by plasma activation using gas plasmas selected to provide the desired surface activation such as, for example, gas plasmas based on hydrogen, oxygen, argon, nitrogen, and/or combinations of such gases. As yet another example, the wetting characteristics of coating 18 may be modified by plasma polymerisation and/or by using variants of and/or mixtures of halo-hydrocarbons (e.g., fluoro-hydrocarbons, chloro-hydrocarbons, etc.) and/or non-halo-hydrocarbons (e.g., polyethylene, polypropylene, etc.). As yet another example, the wetting characteristics of coating 18 may be modified by liquid based chemical etching, which may modify the surface activation and/or surface roughness of coating 18 using, for example, strong acids (e.g., sulphuric acid, nitric acid, etc.) and/or oxidizing agents (e.g., hydrogen peroxide). In some embodiments, the wetting characteristics of coating 18 may be spatially controlled to provide different regions of PCB 10 having different wetting characteristics. A region (on the surface of PCB 10) that has enhanced wetting characteristics may selectively control the direction in which liquid flows across PCB 10. Thus, such a region may act as a "gutter" to direct liquid runoff to areas where the liquid will not cause damage.

In some embodiments, some or all surfaces of PCB 10 may be completely or substantially encapsulated with coating 18. This may protect PCB 10 and/or prevent aqueous absorption and/or "wetting" of PCB 10. In addition, or alternatively, this may reduce any corrosive action from within substrate 14 or from under or adjacent to conductive tracks 16. Thus, coating 18 may protect PCB 10 having an epoxy-based, paper-based, and/or card based substrate 14 which would otherwise absorb liquids (e.g., water, aqueous acids, and corrosive materials) and which may otherwise be vulnerable to corrosion.

PCB 10 comprising coating 18 may provide advantages over uncoated PCBs 10. The disclosed coating 18 may provide none, some, or all of the following advantages. One advantage is that, in some embodiments, coating 18 may permit PCB 10 to operate in harsh and/or corrosive environments. Traditional PCBs 10 have generally been unable to reliably function in such environments. Conductive tracks 16 on uncoated PCBs 10 may corrode, which may result in a far shorter lifetime of the device than would normally be expected. This may occur, for example, when an uncoated PCB 10 is used in very humid environments, especially where microscopic droplets of water comprising dissolved gases such as sulphur dioxide, hydrogen sulphide, nitrogen dioxide, hydrogen chloride, chlorine, ozone, and/or water vapour form a corrosive solution. This may lead to a thin film or corrosion deposit forming between conductive tracks 16 on the uncoated PCB 10, which may cause short circuits. In some cases, manufacturers have applied conformal coatings of a polymer to PCB 10 after soldering electrical components 12 to PCB 10. However, such conformal coatings are generally expensive. Applying such conformal coatings may require an extra step in the manufacturing process after electrical components 12 have been soldered to PCB 10. Such conformal coatings may also require another step to remove the conformal coating when it is necessary to rework a damaged or failed PCB 10 or when it is necessary to test PCB 10 to ascertain its performance or troubleshoot a problem. In contrast to such conformal coatings, coating 18 comprising a halo-hydrocarbon polymer may represent a lower cost and/or higher performance solution for protecting PCB 10 in harsh and/or corrosive environments. In some embodiments, one or more layers 44 of coating 18 may be applied in a conformal fashion to PCB 10 after attaching (e.g., soldering, wire bonding, etc.) electrical components 12 to conductive tracks 16. Thus, coating 18 may be applied to a populated PCB 10 as a conformal coating 18 that provides one or more advantages described herein (e.g., oxidation/corrosion resistance, solder-through capability, wire bonding capability, z-axis conductivity, etc.).

Another advantage is that, in some embodiments, coating 18 may prevent substrate 14, conductive tracks 16, and/or other elements of PCB 10 from absorbing water and/or solvents. The elements of traditional PCBs 10 may comprise materials that absorb water and/or solvents (including aqueous, organic, inorganic, and/or mixed solvents) in liquid, vapour, and/or gaseous form. For example, substrates 14 comprising fabrics (e.g., epoxy resin bonded glass fabrics), paper (e.g., synthetic resin bonded paper, cotton paper, phenolic cotton paper, epoxy, paper, cardboard, etc.), textiles, and/or wood based materials (natural and/or synthetic) may absorb water and/or solvent-based chemicals. As another example, conductive tracks 16 comprising metals, conductive polymers, and/or printed conductive inks may absorb water and/or solvent-based chemicals. As yet another example, PCB 10 may comprise magnetic structures, printed magnetic inks, and/or other elements that may absorb water and/or solvent-based chemicals. Thus, PCB 10 may comprise porous and/or hydrophilic structures having a natural tendency for water and/or solvents that may cause changes to those structures. (The tendency of a material to interact with water and/or solvents in the liquid phase or through condensation from the gas phase may include solid solvents.) When elements of PCB 10 absorb water and/or solvents, one or more problems may result. These problems may include: (i) increased mechanical stresses during thermal cycles due to differences in thermal expansion coefficients; (ii) alteration of adhesion properties of PCB elements; (iii) alterations to the dielectric constant and loss tangent of PCB elements; (iv) swelling of the structure rendering some materials unsuitable for plated through holes and/or for use in some high humidity conditions, especially where high voltages are used; (v) corrosion of conductive tracks 16 at or around the interface between conductive tracks 16 and substrate 14; (vi) loss of mechanical strength; (vii) reordering of material in PCB 10 in the presence of water; and/or (viii) electrolysis in the presence of an applied field leading to corrosion and/or degradation of PCB 10.

Another advantage may be realized where conductive tracks 16 comprise a conductive ink polymer. Conductive ink polymers may tend to absorb liquids and/or moisture, which may result in swelling, modification of electrical properties, and/or degradation of circuit performance. In addition, or alternatively, printed active devices (e.g., as used in plastic electronics) may absorb water and/or solvent-based chemicals, which may change the performance and/or properties of printed active devices. Applying coating 18 to printed active devices and/or conductive tracks 16 comprising conductive ink polymers may prevent water absorption.

In some embodiments, coating 18 may be configured to exhibit conductivity along an axis pointing into the plane of the coated surface (the "z-axis" 22) while acting as an insulator along the axes parallel to the coated surface (the "x-axis" 46 and the "y-axis" 48). Accordingly, coating 18 may be applied to a conductive contact 50 without hindering the ability of such contact 50 to transmit an electrical signal and/or carry current to a mating contact 50. Thus, in some embodiments, coating 18 may protect contacts 50 from oxidation and/or corrosion without hindering the conductivity of contacts 50.

Figure 6A:
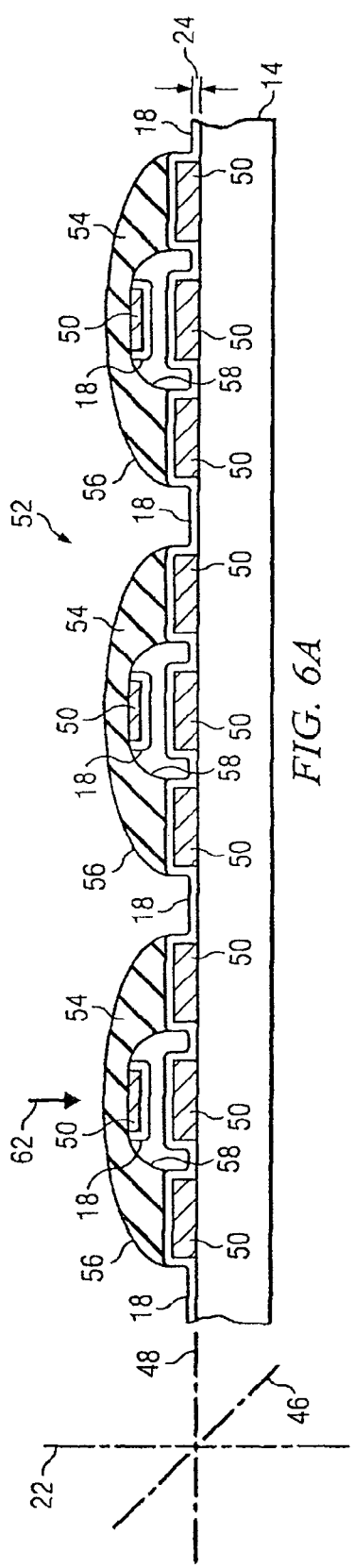
FIGS. 6A-B illustrate a keypad comprising contacts that are coated with a coating, according to certain embodiments.
Figure 6B:
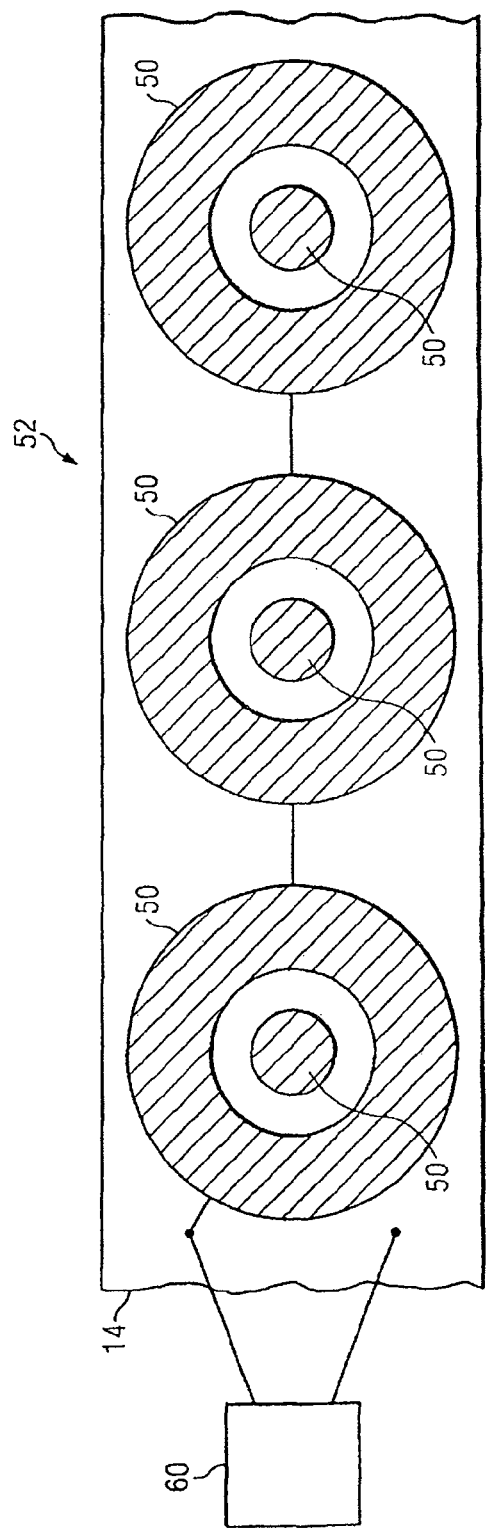

FIGS. 6A-B illustrate a keypad 52 comprising contacts 50 that are coated with coating 18, according to certain embodiments. Keypad 52 may be an input device comprising a plurality of keys 54. By depressing key 54, user may cause keypad 52 to transmit an electrical signal. Keypad 52 may be any suitable type of input device that comprises keys 54. For example, keypad 52 may be a dome-switch keypad 52, a membrane keypad 52, and/or any suitable keypad 52.

Keypad 52 may comprise a plurality of keys 54. In some embodiments, each key 54 comprises an exposed surface 56 that is visible to a user and a concealed surface 58 that is generally not visible to the user. A conductive contact 50 may be attached to the concealed surface 58 of each key 54 in keypad 52. In some embodiments, keypad 52 comprises PCB 10 having a plurality of conductive contacts 50. Each contact 50 on PCB 10 may correspond to one or more keys 54 of keypad 52. Thus, when a user depresses a particular key 54, contact 50 attached to key 54 may touch the corresponding contact 50 attached to PCB 10, thus allowing an electrical signal to flow (e.g., by closing an open circuit).

Keypad 52 may comprise any suitable type of keys 54. Examples of keys 54 include metal "snap dome" keys 54, spring actuated keys 54, and silicon rubber buttons having one or more carbon inserts. In some embodiments, key 54 may represent an area of a membrane keypad 52. A membrane keypad 52 may comprise two membrane layers (e.g., plastic or polymer substrates) that are normally separated by an air space. The inner surfaces of the two membranes may comprise flexible contacts 50 such as, for example, conductive inks (e.g., silver ink), conductive glues, and/or conductive adhesives. The depression of key 54 of a membrane keypad 52 may cause contacts 50 of the two membranes to touch, resulting in transmission of a signal. It should be understood that keypad 52 may comprise any suitable type and/or combination of keys 54.

Contact 50 in keypad 52 may be any suitable conductive device for joining and/or closing an electrical circuit. Contact 50 may comprise an electrode, connector, pin, pad, and/or any suitable conductive device. Contact 50 may comprise any suitable conductive material. For example, contacts 50 may comprise one or more metals such as, for example, stainless steel, nickel, tin, copper, aluminium, gold, silver, and/or any suitable alloy thereof. In some embodiments, contacts 50 may comprise conductive inks, silver loaded epoxy, conductive plastics, and/or nonmetallic conductive materials such as, for example, carbon and/or graphite. Thus, contacts 50 may comprise any suitable type and/or combination of conductive materials.

In some embodiments, one or more contacts 50 in keypad 52 may be coated with coating 18. As explained above, coating 18 may be configured to be electrically conductive in the z-axis direction but to act as an insulator in the x-axis and y-axis directions. In other words, coating 18 may exhibit higher impedance and/or resistance in the x-axis and y-axis directions but low impedance and/or resistance in the z-axis direction. This property may allow contact 50 coated with coating 18 to conduct an electrical signal and/or current through coating 18 to a mating contact 50.

Coating 18 on contact 50 in keypad 52 may have any suitable thickness 24. In some embodiments, thickness 24 of coating 18 on contact 50 is from one nm to two µm. In other embodiments, thickness 24 of coating 18 may be from one nm to five hundred nm. In yet other embodiments, thickness 24 of coating 18 may be from three nm to five hundred nm. In yet other embodiments, thickness 24 of coating 18 may be from ten nm to five hundred nm. In yet other embodiments, thickness 24 of coating 18 may be from ten nm to two hundred and fifty nm. In yet other embodiments, thickness 24 of coating 18 may be from ten nm to thirty nm. In yet other embodiments, coating 18 is a monolayer of a halo-hydrocarbon polymer (having thickness 24 of a few angstroms (Å)). In a preferred embodiment, thickness 24 of coating 18 is from ten nm to one hundred nm in various gradients, with one hundred nm being a preferred thickness 24.

In some embodiments, the optimal thickness 24 of coating 18 may depend on the coating properties that are desired. For example, if very high environmental toughness is required (e.g., high corrosion and abrasion resistance), a thicker coating 18 may be preferred. In some embodiments, thickness 24 of coating 18 may be optimised with different thicknesses 24 at different locations of the device, depending on Which properties are being optimised (e.g., environmental protection versus z-axis conductivity). Coating 18 may be optimised for compliance to avoid cracking when flexed; to minimise wear on coating 18 and/or wear caused by coating 18; for environmental protection; for physical protection of a softer, underlying material; for controlled resistance for circuit trimming; for stability for reference measurements of sensors/electrodes; and/or for surface energy, charge dissipation, and/or blooming.

As noted above, contact 50 coated with coating 18 may conduct an electrical signal and/or current through coating 18 to a mating contact 50. In this context, the phrase "conduct through" may refer to conducting an electrical signal and/or current between two or more contacts 50 without removing coating 18. Thus, coating 18 may be deposited between at least two mating contacts 50 and then a signal and/or current may be conducted between the mating contacts 50 without removing coating 18. The ability to conduct a signal and/or current through coating 18 may be due at least in part to the low impedance and/or resistance of coating 18 in the z-axis direction. Thus, the phrase "conduct through" may refer to conducting an electrical signal and/or current between two or more contacts 50 without removing coating 18.

The conductivity of coating 18 may be measured according to any suitable technique. In some embodiments, the conductivity of coating 18 may be measured by determining the resistance of coating 18. Such measurement may be achieved by soldering conductive wires to contacts 50 and connecting wires to a resistance meter 60. A predetermined force 62 may cause contacts 50 to touch each other (e.g., be brought into electrical contact). As illustrated in FIG. 6B, resistance meter 60 may then measure the resistance through coating 18 between the corresponding contacts 50. As a reference point, the resistance of contacts 50 themselves may be determined by measuring the resistance between uncoated contacts 50. According to certain embodiments, coating 18 may exhibit z-axis resistance in a range from zero to ten kilo-ohms (ill). In a preferred embodiment, coating 18 may exhibit z-axis resistance in a range from zero to one ohms (n).

Figure 7:
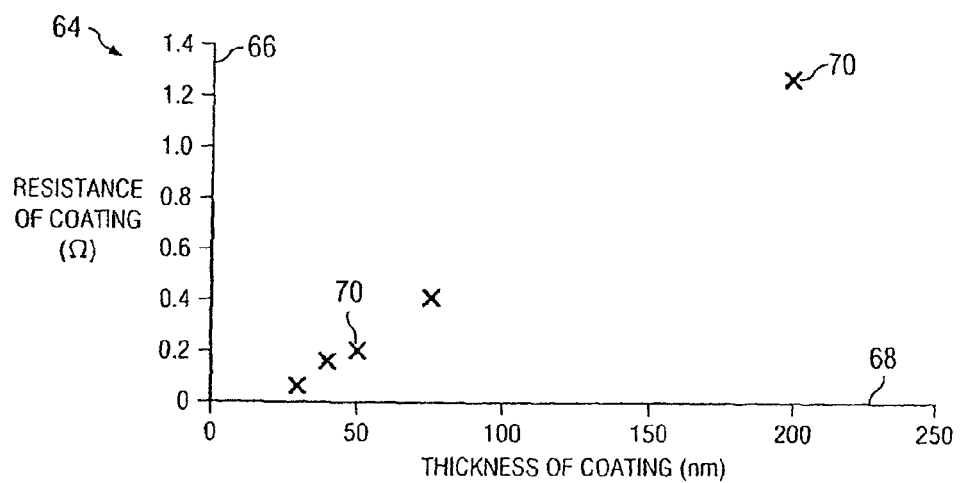
FIG. 7 is a graph illustrating the z-axis conductivity of example coatings having various thicknesses, according to certain embodiments.

FIG. 7 is a graph 64 illustrating the z-axis resistance of example coatings 18 having various thicknesses 24, according to certain embodiments. The metrics illustrated in graph 64 are example values of z-axis resistance for example coatings 18. It should be understood, however, that coatings associated with different materials, structures, deposition techniques, and/or other factors may exhibit different amounts of z-axis conductivity. Although graph 64 illustrates z-axis resistance in relation to thickness 24, it should be understood that other variables (e.g., materials, structure, deposition method, etc.) may affect the z-axis conductivity of coating 18.

In the illustrated example, the z-axis resistance of an example coating 18 on keypad 52 was measured using resistance meter 60, as illustrated in FIG. 6B. Contacts 50 in this example were coated with a PTFE type material. A metal "snap-dome" key 54 was used as one of contacts 50. Electrical wires were soldered to contacts 50 and connected to resistance meter 60. A predetermined force 62 (approximately five Newton meters) was applied to one contact 50, causing that contact 50 to touch a corresponding contact 50. Resistance meter 60 then measured the electrical resistance between the touching contacts 50. The predetermined force 62 was applied by using ENIG plated tracks and by varying force 62 until a stable resistance measurement was made. The measurement was repeated for coatings 18 of different thicknesses 24. The resulting readings were adjusted to account for (i) the fact that two thicknesses 24 of coating 18 (i.e., one thickness 24 for each contact 50) were present in the measurement path and (ii) the resistance of the particular contacts 50 without coating 18. The resistance of contacts 50 was determined by using an uncoated PCB 10 as a reference.

The results of these measurements are illustrated in graph 64 in FIG. 7 and in the table below. Graph 64 in FIG. 7 comprises a first axis 66 that corresponds to the resistance of coating 18 and a second axis 68 that corresponds to thickness 24 of coating 18. The measured resistances are illustrated as points 70 in graph 64.

| Coating thickness (nm) | Resistance of coating (Ω) |
|---|---|
| 30 | 0.0704 |
| 40 | 0.1688 |
| 50 | 0.2095 |
| 75 | 0.4105 |
| 200 | 1.2775 |

Although the foregoing example illustrates the resistance of a particular coating 18 comprising a PTFE type material, it should be understood that coating 18 may comprise any suitable type and/or combination of halo-hydrocarbon polymers. Although the foregoing example illustrates the resistance of coating 18 having particular thicknesses 24, it should be understood that coating 18 may be configured to have any suitable thickness 24.

Generally, contacts 50 in a device may be coated with coating 18 before or after construction of the device. In a preferred embodiment, contacts 50 are coated with coating 18 before construction of the device. Coating 18 may be applied to one, some, or all of the surfaces of contact 50. In some embodiments, coating 18 may be applied to one or more surfaces of the device (e.g., keypad 52). Coating 18 may be applied to surfaces of contact 50 and/or device that will be exposed to the environment such as, for example, surfaces that act as electrical contact areas between two or more parts of a circuit. Applying coating 18 to the surfaces of device in addition to the surfaces of contact 50 may (i) increase the protection of the device from corrosion and/or oxidation and/or (ii) prevent the formation of spoilage routes to contact areas in device.

Coating 18 may be deposited on contacts 50 according to any suitable technique. For example, coating 18 may be deposited using chemical vapour deposition (CVD), molecular beam epitaxy (MBE), plasma enhanced-chemical vapour deposition (PE-CVD), high pressure/atmospheric plasma deposition, metallo-organic-chemical vapour deposition (MO-CVD), and/or laser enhanced-chemical vapour deposition (LE-CVD). In some embodiments, coating 18 may be deposited on contacts 50 by the creation of inter-penetrating polymer networks (IPNs) and/or by surface absorption of monolayers (SAMs) of polymers or monomers to form in-situ polymers and/or polymer alloys. In other embodiments, coating 18 may be deposited using a liquid coating technique such as, for example, liquid dipping, spray coating, spin coating, sputtering, and/or a sol-gel process.

According to certain embodiments, coating 18 may be deposited on contacts 50 using plasma deposition, as described above with respect to FIG. 2. Thus, contacts 50 may be placed in chamber 30 in reactor 28. Reactor 28 may then introduce gases (e.g., hydrogen, argon, and/or nitrogen) into chamber 30 to clean contacts 50. In one or more steps, reactor 28 may then introduce one or more precursor compounds 36 into chamber 30 to form a single-layer or multi-layer coating 18 on contacts 50 by plasma deposition. In some embodiments, coating 18 may follow the three dimensional form of contact 50. The preferred method for depositing coating 18 on contacts 50 may depend on the particular thickness 24 of coating 18 that is desired. Liquid coating techniques may be preferred for thicker coatings 18, while plasma deposition may be preferred for thinner coatings 18.

The technique used to deposit coating 18 on contacts 50 may be configured to control the z-axis conductivity of coating 18. In some embodiments, the z-axis conductivity of coating 18 may be controlled by regulating one or more of the following factors:

Composition of halo-hydrocarbon material in coating 18, which may include combining different halo-hydrocarbon materials and controlling the gradation between layers 44 of the different materials.

Ratios of halogen atoms/hetero-atoms/carbon atoms In the halo-hydrocarbon material in coating 18.

Proportion of carbon in the halo-hydrocarbon coating material.

Degree of conjugation in the halo-hydrocarbon coating material.

Average molecular weight of the halo-hydrocarbon coating material.

Degree of branching and cross-linking in the halo-hydrocarbon coating material.

Molecular size distribution of molecules in the halo-hydrocarbon coating material.

Density of the halo-hydrocarbon coating material.

Presence of additional doping agents in the halo-hydrocarbon coating material.

Presence of ionic/salt, ionic, and/or covalent components In the halo-hydrocarbon coating material.

Presence of organic/polymer and inorganic compounds comprising transition metals, including complex cations and anions in the halo-hydrocarbon coating material.

Presence of compounds and/or elements having variable oxidation states in the halo-hydrocarbon coating material.

Presence of chemical compounds having delocalized character in the halo-hydrocarbon coating material.

Presence of occluded components in the halo-hydrocarbon coating material.

When coating 18 is deposited by plasma deposition, adjustment of plasma conditions (e.g. power, gas pressure, electrode arrangement).

Thickness of the halo-hydrocarbon coating material (e.g., thicker coatings 18 may exhibit greater resistance than thinner coatings 18 of the same material).

Orientation of coating 18.

Continuity of coating 18 (e.g., porosity and/or three-dimensional structure).

Although keypad 52 is described in the examples above, coating 18 may be applied to contacts 50 in any type of device. For example, coating 18 may be applied to contacts 50 in safety switches, alarm switches, fuse holders, keypads 52 on mobile telephones, touch screens, batteries, battery terminals, semiconductor chips, smart cards, sensors, test chips, elastomeric connectors (e.g., Zebra strips), electrical connectors (e.g., sockets and plugs), terminators, crimped connectors, press-fit connectors, and/or sliding contacts 50 such as, for example, those used in chips, smart cards, tokens, and/or reader mechanisms.

Figure 8:
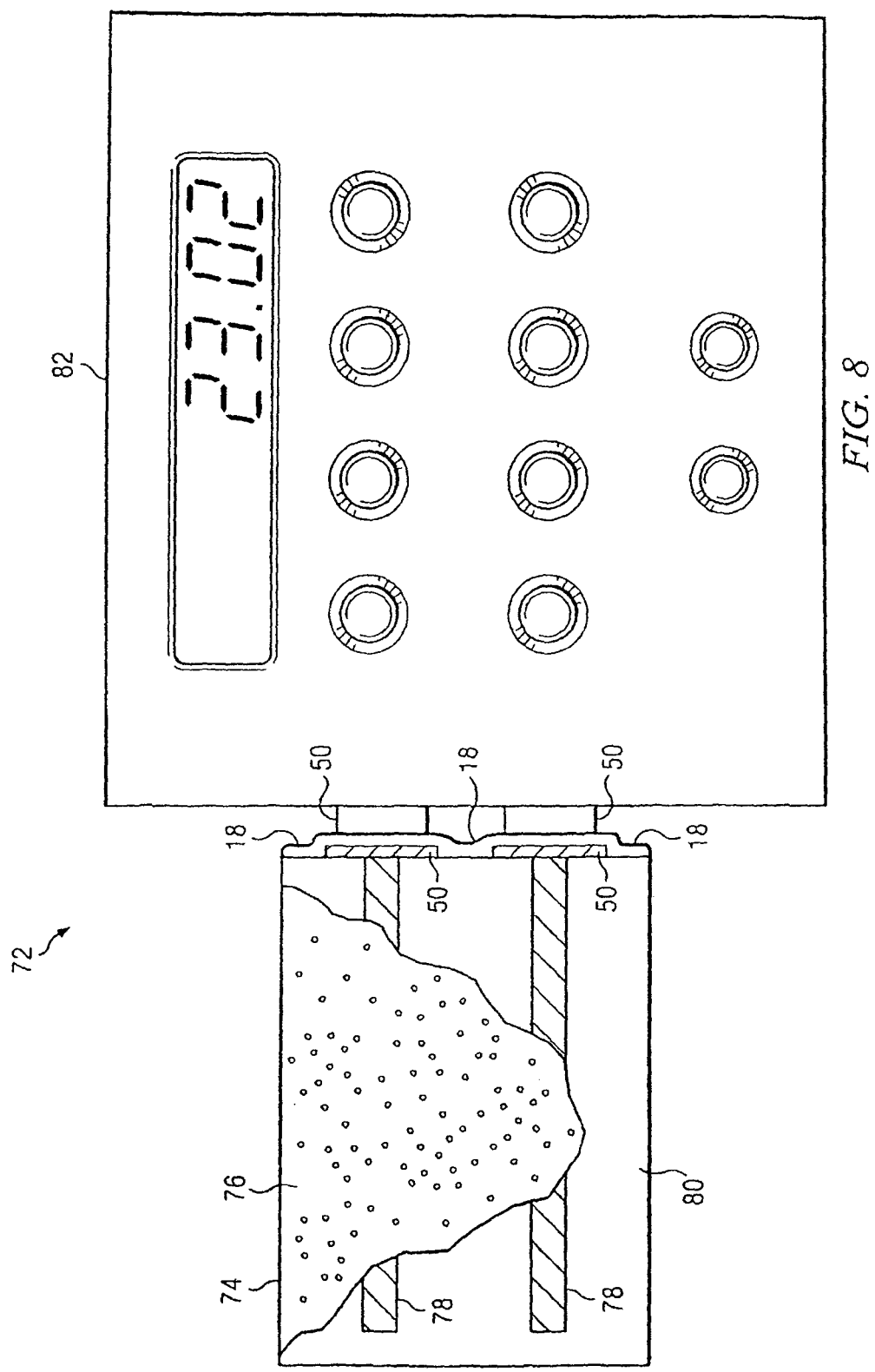
FIG. 8 illustrates a measuring device comprising a sensor having coated contacts, according to certain embodiments.

FIG. 8 illustrates a measuring device 72 comprising a sensor 74 having coated contacts 50, according to certain embodiments. Sensor 74 may be any suitable type of sensor 74. In some embodiments, sensor 74 is a disposable sensor 74 that measures analytes such as, for example, toxic gases, glucose, physiological fluid-based chemical compounds, and/or other chemical compounds. Sensor 74 may comprise a membrane 76, one or more electrodes 78, one or more contacts 50, and a sensor substrate 80. Membrane 76 may be any suitable material that filters a fluid to allow analytes to reach electrodes 78. In some embodiments, membrane 76 may be a biocompatible membrane. Thus, analytes may diffuse through membrane 76 and react at an electrolyte-catalyst interface, which may create an electrical current.

Electrodes 78 in sensor 74 may comprise a catalyst and/or other material configured to interact with analytes. For example, electrode 78 may be a enzyme electrode comprising glucose oxidase and/or dehydrogenase. The interaction of analytes with electrode 78 may generate a signal that is electrical or may be converted into an electrical signal. One or more contacts 50 in sensor 74 may transmit the electrical signal to the main body 82 of measuring device 72. In some embodiments, contacts 50 on electrodes 78 are in electrical contact with the main body 82 of measuring device 72 such that an electrical circuit is made with the main body 82 of measuring device 72. In some embodiments, the total charge passing through contacts 50 may be proportional to the amount of analytes in the fluid that has reacted with the enzyme at electrode. Measuring device 72 may be configured and/or calibrated to measure the signal from contacts 50 and to report the presence and/or concentration of analytes.

Electrodes 78 may be affixed to and/or printed on sensor substrate 80. In some embodiments, sensor 74 may comprise a power source coupled to electrodes 78. Sensor 74 may be configured to detect analytes in a gas and/or liquid state.

Contacts 50 in sensor 74 may comprise any suitable material. In some embodiments, contacts 50 comprise a soft contact material such as, for example, carbon, conductive inks, and/or silver loaded epoxy. In some embodiments, contact 50 in sensor 74 may make electrical contact with another contact 50 in the main body 82 of measuring device 72, thus forming a circuit between sensor 74 and the main body 82 of measuring device 72. Contacts 50 may be coated with coating 18 of any suitable thickness 24 (e.g., from one nm to two μm). One or more contacts 50 in sensor 74 may be uncoated.

In some embodiments, the main body 82 of measurement device is reusable while sensor 74 is disposable (e.g., only used once). In other embodiments, sensor 74 may be a multi-use sensor 74 or otherwise designed for a long lifetime. The connection between the main body 82 of measurement device and sensor 74, through contacts 50, may be reproducible and/or may provide a constant or essentially constant resistance. As noted above, contacts 50 may comprise a soft contact material such as, for example, carbon, conductive inks, and/or silver load epoxy. Without coating 18, particles from these soft materials could break away from contacts 50 and accumulate on components within the main body 82 of measuring device 72. By applying coating 18 to contacts 50, however, one may prevent these soft materials from breaking away from contacts 50 and accumulating on components in the main body 82 of measuring device 72.

Although the foregoing example describes applying coating 18 to contacts 50 of an analyte sensor 74, it should be understood that coating 18 may be applied to contacts 50 or other components of any type of sensor 74 or suitable other device. For example, coating 18 may be applied to any suitable device or system where soft (e.g., carbon) pads are used to make a repeated electrical connection. Such systems may use the same sensor 74 many times or may use the same device repeatedly with disposable sensors 74.

In some embodiments, coating 18 on contact 50 of a device may comprise a very thin layer (e.g., five nm or less) of metal halide (preferably a metal fluoride) directly on the surface of contact 50. In some embodiments, the metal halide layer may be a monolayer, substantially a monolayer, or a few monolayers. In other embodiments, the metal halide layer may comprise a metal halide zone of layers at the surface of contact 50. The metal halide layer on contact 50 may be robust, may be inert, and/or may prevent the formation on contact 50 of oxide layers and/or other tarnishes which may prevent effective electrical contact or subsequent processing.

In embodiments where coating 18 is applied by plasma deposition, a metal halide layer may form on contact 50 when active species in the gas plasma react with the metal surface of contact 50. In some embodiments, the metal halide layer may be enhanced using a higher concentration of fluorine species. A layer of coating 18 comprising a halo-hydrocarbon polymer may then be deposited on and/or In combination with the metal halide layer. The metal halide layer and the layer of halo-hydrocarbon polymers may be discrete, axially or spatially. Alternatively, there may be a graded transition from metal halide to halo-hydrocarbon polymer in coating 18 on contact 50. In some embodiments, the metal halide layer may protect contact 50 from oxidation while the layer of halo-hydrocarbon polymers (i) may provide environmental protection from corrosive gases and/or liquids and/or (ii) may provide oxidation protection. Should the layer of halo-hydrocarbon polymers in coating 18 eventually be worn away by mechanical abrasion, the underlying metal halide layer may prevent oxidation build-up, thus enabling contact 50 to continue to make an electrical connection.

In some embodiments, the surface properties of coating 18 may be configured to permit components to be bonded to the surface of coating 18. For example, coating 18 may be configured to permit adhesion between the surface of coating 18 and electrical components 12. In some embodiments, the annealing and/or thermal properties of coating 18 may be configured such that one or more layers 44 of coating 18 may be selectively removed from a coated device.

Applying coating 18 to contacts 50 may provide advantages over traditional devices. Coating 18 may provide none, some, or all of the following advantages. One advantage is that coating 18 may prolong the life of contacts 50 by protecting them from environmental damage and/or corrosion. Some devices are typically used in very humid environments. In such environments, microscopic droplets of water comprising dissolved gases (e.g., sulfur dioxide, hydrogen sulfide, nitrogen dioxide, hydrogen chloride, chlorine, ozone, and/or water vapour) may form a corrosive solution. Such droplets of moisture may form a thin film or deposit of corrosion on contacts 50 in a device. Such corrosion may degrade and shorten the useful life of contacts 50. Traditional coating substances such as, for example, traditional polymers and plastics are normally insulators and have therefore proven to be unsuitable for coating contacts 50. Coating 18 comprising halo-hydrocarbon polymers, however, may exhibit conductivity in the z-axis direction. Accordingly, coating 18 may not hinder the ability of contacts 50 to receive and/or transmit signals. In addition, or alternatively, where contacts 50 are coated with coating 18, contacts 50 may be protected from corrosion.

Another advantage is that coating 18 may preserve the integrity of the surface of contacts 50. As explained above, corrosion and/or oxidation of contacts 50 may prevent and/or interfere with the ability of contacts 50 to make electrical connection with each other. This problem may occur where the corrosion and/or oxidation causes the formation of an insulating layer over the surface of contacts 50 and/or a physical change to the surface of contacts 50 which prevents contacts 50 from making good electrical contact with each other. This problem may arise, for example, where an uncoated contact 50 is a safety switch or connector for an alarm system. Such systems are frequently inactive for long periods of time but should function correctly when required. Uncoated contacts 50 may become disconnected where the corrosion forms an insulating barrier between the mating contacts 50 such as, for example, in fuse holders and battery terminals. Where contacts 50 are coated with coating 18, however, contacts 50 may be protected from corrosion and/or oxidation. Thus, coating 18 may preserve the surface integrity of contacts 50.

Another advantage is that coating 18 may protect contacts 50 from corrosion. In devices comprising uncoated contacts 50, corrosion may prevent movement of contacts 50 that are designed to move. In some cases, corrosion may change the resistance/performance of a circuit and/or degrade removable elements of a device. Where contacts 50 are coated with coating 18, however, contacts 50 may be protected from corrosion, thereby extending the life of a device comprising contacts 50.

As explained above, electrical component 12 may be attached to PCB 10 by soldering through coating 18 (without first removing coating 18) to form solder joint 26 between electrical component 12 and conductive track 16 of PCB 10. In other embodiments, electrical component 12 may be attached to a coated PCB 10 by wire bonding electrical component 12 to conductive track 16 of PCB 10.

Figure 9:
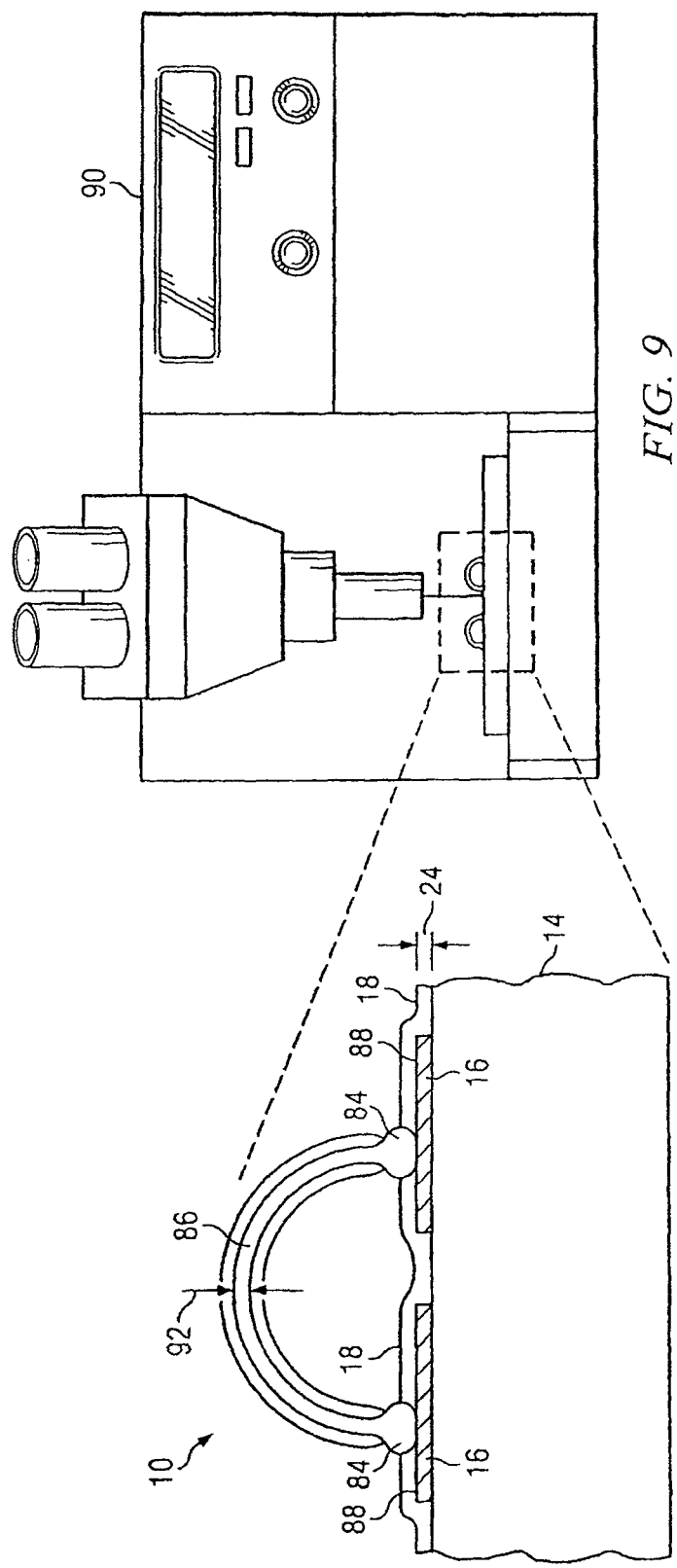
FIG. 9 illustrates a wire bond that is formed through a coating, according to certain embodiments.

FIG. 9 illustrates a wire bond 84 that is formed through coating 18, according to certain embodiments. Wire bond 84 may be formed between wire 86 and any suitable surface. In some embodiments, wire bond 84 may be formed between wire 86 and a surface of electrical component 12, conductive track 16, and/or circuit element. The surface on which wire bond 84 is formed may be referred to as a contact surface 88. In the illustrated embodiment, both wire 86 and contact surface 88 are coated with coating 18. In other embodiments, wire 86 may be coated and contact surface 88 may be uncoated. In yet other embodiments, wire 86 may be uncoated and contact surface 88 may be coated. In some embodiments, coating 18 is only applied to the areas of wire 86 and/or contact surface 88 where wire bond 84 is to be formed. In other embodiments, coating 18 is applied over all or substantially all of wire 86 and/or contact surface 88.

The term "wire bonding" generally refers to a technique for joining electrical components 12 and/or circuit elements in the absence of solder 38 and/or flux 42. In some embodiments, wire bonding may be used to make an electrical connection between two or more components using a conductive wire 86. Wire bonding may be used to make interconnections between an integrated circuit in bare die form and the leadframe inside the integrated circuit. In addition, or alternatively, wire bonding may be used to make interconnections between a bare die and PCB 10.

Wire bond 84 may be formed on contact surface 88 using wire 86 and a wire bonder 90. Wire bond 84 may be formed using any suitable type of wire 86. The term "wire" may refer to one or more elongated strands of conductive material. In some embodiments, wire 86 may carry an electrical current, transmit an electrical signal, and/or bear a mechanical load. In some embodiments, wire comprises a pin, a filament, an electrical lead, and/or a leg of electrical component 12.

Wire 86 may comprise any suitable material. In some embodiments, wire 86 comprises one or more conductive materials such as, for example, common metals, precious/rare metals, conductive polymers, and/or conductive non-metallic materials. In a preferred embodiment, wire 86 comprises gold, aluminum, copper, and/or silver. In other embodiments, wire 86 comprises nickel, palladium, platinum, rhodium, iridium, tin, lead, germanium, antimony, bismuth, indium, gallium, cobalt, iron, manganese, chromium, vanadium, titanium, scandium, zirconium, molybdenum, tungsten, other transitional metals, and/or other suitable materials. Wire 86 may comprise any suitable metal alloy and/or combination of conductive materials. In some embodiments, wires 86 comprising metals (including alloys) that readily oxidize and/or tarnish may especially benefit from coating 18. Applying coating 18 to wires 86 may extend the shelf life and/or functional life of devices comprising wires 86.

Wire 86 may have a cross section that is circular, rectangular, or any other suitable shape. In some embodiments, wire 86 having a rectangular cross section is referred to as a ribbon. In embodiments where wire 86 has a circular cross section, wire 86 may have diameter 92 in the range of five μm to one mm. In other embodiments, wire 86 has diameter 92 in the range of ten μm to two hundred μm. In a preferred embodiment, wire 86 has diameter 92 in the range of fifteen μm to seventy-five μm. In embodiments where wire 86 has a rectangular cross section, a side of wire 86 may have a dimension in the range of five μm to one mm. In other embodiments, a side of a rectangular wire 86 may have a dimension in the range of ten μm to two hundred μm. In a preferred embodiment, a side of a rectangular wire 86 may have a dimension in the range of twenty μm to seventy-five μm. Different types of wires 86 may require different wire bonding equipment and/or parameters.

Wire bonder 90 is generally operable to form wire bond 84 between wire 86 and contact surface 88. Wire bonder 90 may be any suitable type of machine that uses heat and/or pressure to form bonds between wires 86 and contact surfaces 88. Wire bonder 90 may be a wedge-wedge wire bonder 90, a ball-wedge wire bonder 90, a three way convertible wire bonder 90, an ultrasonic insulated wire bonder 90, a high frequency wire bonder 90, a manual wire bonder 90, and automatic wire bonder 90, and/or any suitable type of wire bonder 90. In some embodiments, wire bonder 90 comprises a needle-like tool (referred to as a capillary) through which wire 86 is threaded. Wire bonder 90 may position an end of wire 86 on contact surface 88 to form either a ball bond 84a or a wedge bond 84b. The terms "ball" and "wedge" generally refer to the geometry of wire 86 at the point where the connection is made. These two methods of wire bonding—ball bonding and wedge bonding—may use different combinations of heat, pressure, and/or ultrasonic energy to make a weld at either or both ends of wire 86.

Figure 10A:
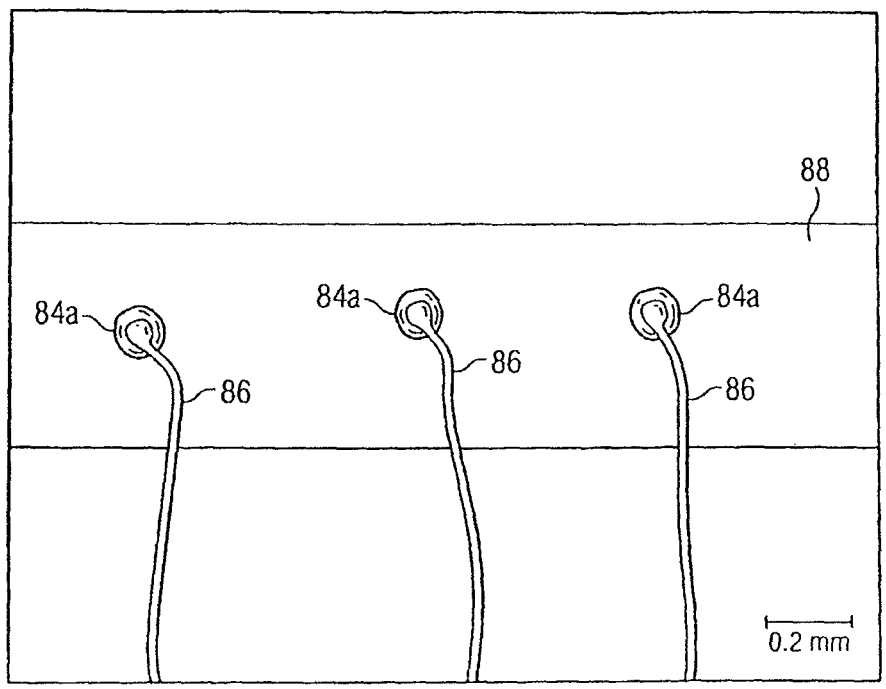
FIG. 10A illustrates a microscope image of ball bonds formed between uncoated wires and a coated contact surface, according to certain embodiments.

In some embodiments, wire bonder 90 forms ball bond 84a by applying a high-voltage electric charge to wire 86, which may melt wire 86 at the tip of the capillary of wire bonder 90. The tip of wire 86 may form into a ball due to the surface tension of the molten metal. Before, during, or after the ball solidifies, wire bonder 90 may actuate the capillary, causing the end of wire 86 to touch contact surface 88. Wire bonder 90 may then apply heat, pressure, and/or ultrasonic energy to create a weld between the end of wire 86 and contact surface 88. Thus, wire bonder 90 may form ball bond 84a. FIG. 10A illustrates a microscope image of ball bonds 84a formed between uncoated wires 86 and a coated contact surface 88, according to certain embodiments. Wires 86 and contact surface 88 may comprise any suitable type and/or combination of conductive materials. In the illustrated embodiment, wire 86 comprises gold and contact surface 88 comprises copper. Contact surface 88 may be pre-treated before coating 18 is applied to contact surface 88. In the illustrated example, contact surface 88 was pre-treated with a liquid based sulphuric acid/hydrogen peroxide solution. After drying, the example contact surface 88 was then treated with hydrogen plasma, after which coating 18 was deposited on contact surface 88. In the illustrated example, ball bond 84a between wire 86 and contact surface 88 were formed after coating 18 was deposited on contact surface 88. Although the foregoing example illustrates contact surface 88 that was pre-treated with a particular solution and hydrogen plasma, it should be understood that any suitable surface treatment may be used prior to applying coating 18. It should be further understood that, in some embodiments, no surface treatment of contact surface 88 may occur prior to applying coating 18.

Figure 10B:
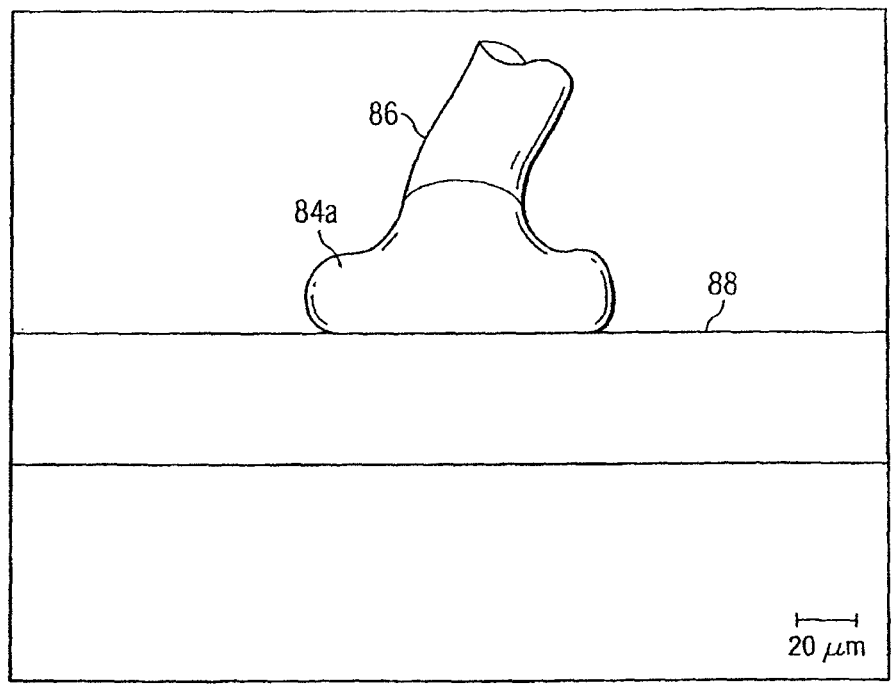
FIG. 10B illustrates a microscope image of a section view of a ball bond between an uncoated wire and a coated contact surface, according to certain embodiments.

FIG. 10B illustrates a microscope image of a section view of ball bond 84a between an uncoated wire 86 and a coated contact surface 88, according to certain embodiments. Wires 86 and contact surface 88 may comprise any suitable type and/or combination of conductive materials. In the illustrated embodiment, wire 86 comprises gold and contact surface 88 comprises copper. Contact surface 88 may be pre-treated before coating 18 is applied to contact surface 88. In the illustrated example, contact surface 88 was pre-treated with a liquid based sulphuric acid/hydrogen peroxide solution. After contact surface 88 dried, coating 18 was deposited on the example contact surface 88. The coated contact surface 88 in this example was then post treated with a hydrogen plasma. In this example, ball bond 84a was then formed between wire 86 and contact surface 88.

Although the foregoing example illustrates contact surface 88 that was pretreated with a particular solution and post-treated with hydrogen plasma, it should be understood that contact surface 88 may receive any suitable pre-treatment and/or post-treatment. It should be further understood that, in some embodiments, no surface treatment of contact surface 88 may occur before or after applying coating 18.

Figure 11A:
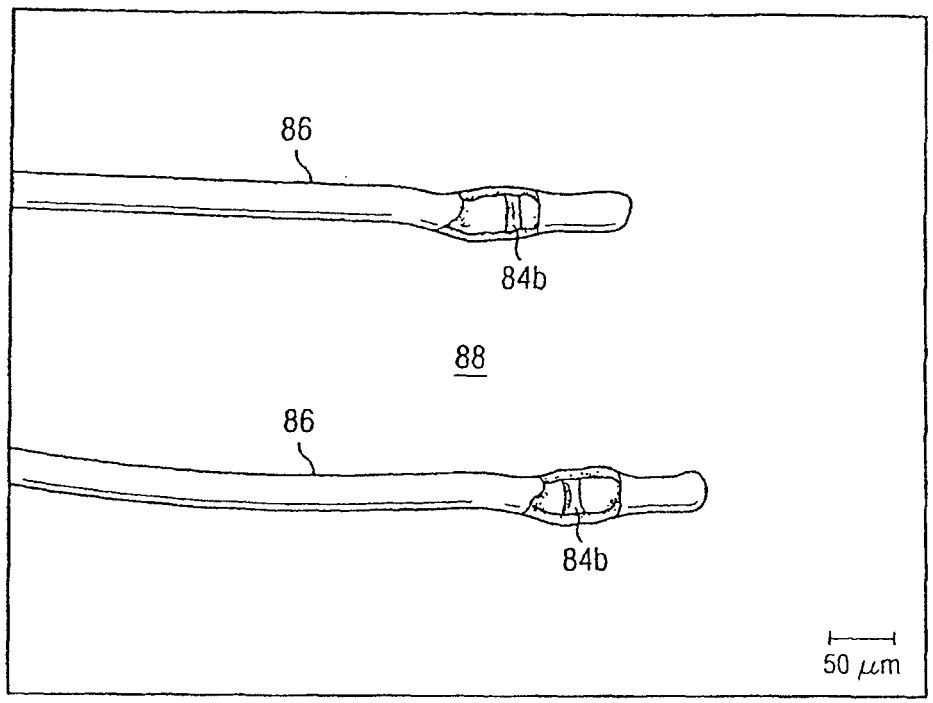
FIG. 11A illustrates a microscope Image of wedge bonds between uncoated wires and a coated contact surface, according to certain embodiments.
Figure 11B:
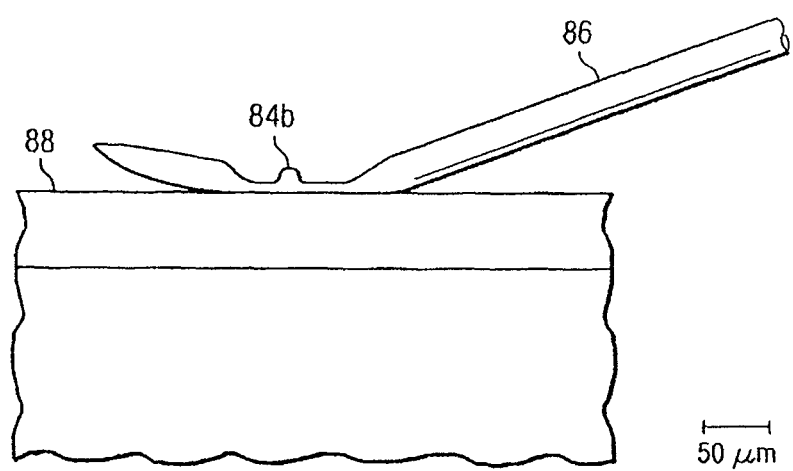
FIG. 11B illustrates a microscope image of a section view of a wedge bond between a coated wire and a coated contact surface.

In some embodiments, wire bonder 90 forms wedge bond 84b between wire 86 and contact surface 88. Wire bonder 90 may form wedge bond 84b by crushing wire 86 against contact surface 88. After forming wedge bond 84b, wire bonder 90 may cut wire 86. FIG. 11A illustrates a microscope image of wedge bonds 84b between uncoated wires 86 and a coated contact surface 88, according to certain embodiments. FIG. 11B illustrates a microscope image of a section view of wedge bond 84b between a coated wire 86 and a coated contact surface 88.

Figure 12:
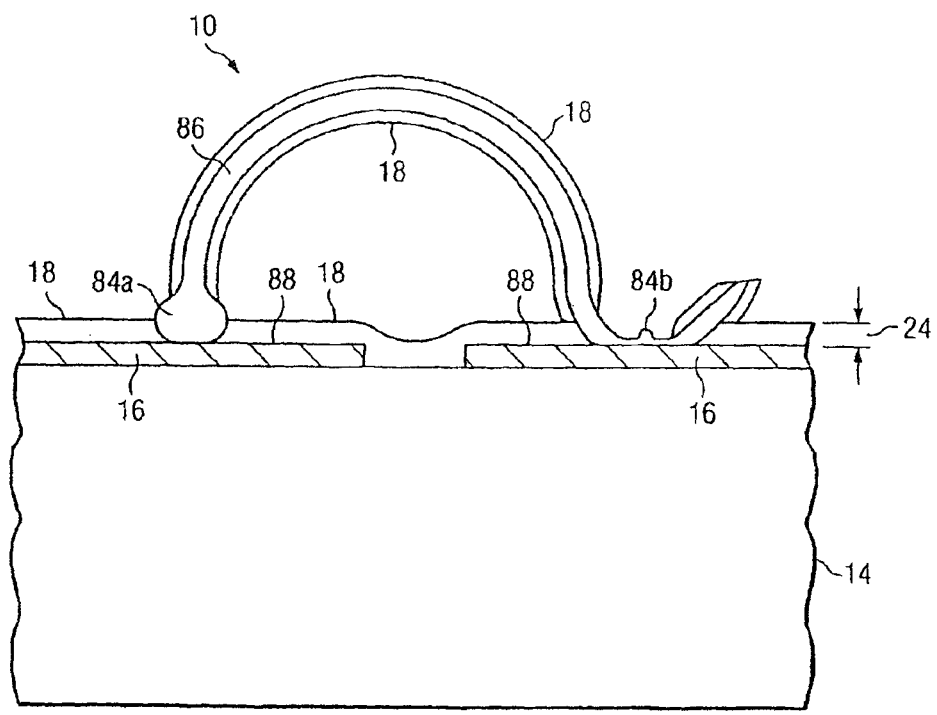
FIG. 12 illustrates a PCB having a ball bond and a wedge bond, according to certain embodiments.

Wire bonder 90 may be configured to form ball bond 84a at one end of wire 86 and to form wedge bond 84b at the other end of wire 86. This process may be referred to as ball-wedge bonding. FIG. 12 illustrates PCB 10 having ball bond 84a and wedge bond 84b, according to certain embodiments. In some embodiments, wire bonder 90 may first form ball bond 84a between contact surface 88 and a molten, spherical ball at the end of wire 86. Ball bond 84a may be formed using thermal and/or ultrasonic energy. Wire bonder 90 may then use wire 86 to form a loop of a desired height and shape. Once the loop is in the desired position for formation of a second bond, wire bonder 90 may form wedge bond 84b between wire 86 and contact surface 88. After forming wedge bond 84b, wire bonder 90 may cut wire 86, leaving a free end that can be formed into a spherical ball which can be used to form the next wire bond 84.

In some embodiments, wire bonder 90 may be configured to form wedge bonds 84b at both ends of wire 86. This process may be referred to as wedge-wedge bonding. Wedge bonding may rely on a combination of ultrasonic and frictional energy. Wedge bond 84b may be formed with or without a contribution of additional thermal energy introduced by heating wire 86. In some embodiments, wedge bonds 84b may be preferred for connecting wires 86 to conductive tracks 16 of PCB 10.

Generally, a good wire bond 84 may be achieved by using wire 86 and contact surface 88 that are free or substantially free of contaminants such as, for example, oxidation products. Traditionally, achieving good wire bonds 84 using copper wire 86 has been difficult because copper readily oxidizes under normal atmospheric conditions. Layers of copper oxide on the surface of wire 86 and/or contact surface 88 may make the formation of wire bonds 84 difficult. In addition, the elevated temperatures required for wire bonding may lead to increased oxidation. As a result, manufacturers either have avoided using wire 86 that readily oxidizes (e.g., copper wire) or have required the use of inert atmospheres to prevent oxidation. In some cases, manufacturers try to clean copper wires 86 immediately before wire bonding to remove build-up of copper oxide and/or other tarnishes from the surface of the copper wires 86. Cleaning of the copper wires 86 and/or using inert atmospheres have introduced complications and expense to the wire bonding process. As a result, some types of wire 86 (e.g., copper wire) have not been commonly used in wire bonding.

Applying coating 18 to wire 86 and/or contact surface 88 may alleviate some, all, or none of the above problems. In some embodiments, applying coating 18 comprising a halohydrocarbon polymer to wire 86 and/or contact surface 88 may protect wire 86 and/or contact surface 88 from oxidation and/or corrosion. Thus, coating 18 may prevent the formation of oxide and/or corrosive layers that would hinder the bonding of wire 86 to contact surface 88. In some embodiments, coating 18 may be configured such that wire bonds 84 can be formed through coating 18 without the prior removal of coating 18 from wire 86 and/or contact surface 88. By preventing oxidation and/or by allowing wire bonds 84 to be formed through coating 18, coating 18 may reduce the expense and/or difficulty of the wire bonding process.

In some embodiments, both wire 86 and contact surface 88 are coated with coating 18. Coating 18 on wire 86 may be identical or substantially identical to coating 18 on contact surface 88. Alternatively, coating 18 on wire 86 may comprise different halo-hydrocarbon polymers than coating 18 on contact surface 88. In other embodiments, wire 86 is uncoated and contact surface 88 is coated with coating 18. In yet other embodiments, wire 86 is coated with coating 18 and contact surface 88 is uncoated. Coating 18 on wire 86 and/or contact surface 88 may be continuous, substantially continuous, or non-continuous. A continuous or substantially continuous coating 18 may be preferred for high levels of protection from harmful environments. Non-continuous coatings 18 may be preferred for other purposes.

Coating 18 on wire 86 and/or contact surface 88 may have any suitable thickness 24. In some embodiments, thickness 24 of coating 18 is from one nm to two μm. In other embodiments, thickness 24 of coating 18 is from one nm to five hundred nm. In yet other embodiments, thickness 24 of coating 18 is from three nm to five hundred nm. In yet other embodiments, thickness 24 of coating 18 is from ten nm to five hundred nm. In yet other embodiments, thickness 24 of coating 18 is from ten nm to two hundred and fifty nm. In yet other embodiments, thickness 24 of coating 18 is from ten nm to thirty nm. In yet other embodiments, coating 18 is a monolayer of a halo-hydrocarbon polymer (e.g., having thickness 24 of a few angstroms (Å)). In a preferred embodiment, thickness 24 of coating 18 is from ten nm to one hundred nm in various gradients, with one hundred nm being a preferred thickness 24. Coating 18 on wire 86 and/or contact surface 88 may be a single-layer coating 18 or a multi-layer coating 18.

The optimal thickness 24 of coating 18 may depend on the particular properties that are desired for wire 86 and/or contact surface 88 after wire bond 84 is formed. For example, if one desires a high level of corrosion resistance, abrasion resistance, and/or environmental toughness, a thicker coating 18 may be desired. Thus, thickness 24 of coating 18 may be configured and/or optimized for the particular requirements of a device.

As explained above, coating 18 may be configured so that wire bonder 90 can form wire bond 84 through coating 18. In other words, wire bonder 90 may be operable to bond wire 86 to contact surface 88 without first removing coating 18 from wire 86 and/or contact surface 88. Thus, the wire bonding process may selectively alter coating 18 in the area of wire bond 84. In some embodiments, coating 18 is selectively removed from wire 86 and/or contact surface 88 by the wire bonding process only in the local area of wire bond 84 such that coating 18 remains intact right up to wire bond 84. Thus, coating 18 may abut wire bond 84 after wire bond 84 is formed. In some embodiments, coating 18 remains intact on wire 86 and/or contact surface 88 everywhere except where wire bond 84 is made. Because coating 18 may remain intact right up to wire bond 84, coating 18 may protect wire 86, contact surface 88, and/or the remainder of the device from oxidation, corrosion, and/or environment effects after wire bond 84 is formed. Thus, coating 18 may provide long-term stability and protection for a device.

In some embodiments, coating 18 on wire 86 and/or contact surface 88 is displaced by the action and/or processes of wedge bonding and/or ball bonding. In these bonding methods, energy may be effectively coupled into the region of wire bond 84. This energy may facilitate the displacement of coating 18 on contact surface 88 and/or wire 86 and enable the formation of wire bond 84. As explained above, wedge bonding may rely on a combination of ultrasonic and frictional energy with or without a contribution of additional thermal energy introduced by heating wire 86. In contrast, ball bonding may be primarily a thermosonic process. For both wedge bonding and ball bonding, coating 18 may be displaced selectively in the region of wire bond 84 by frictional and/or thermal action. As a result, coating 18 may be displaced as either a solid material, by a phase change, and/or by vaporisation.

Wire bonds 84 that are formed through coating 18 between wires 86 and/or contact surfaces 88 may exhibit good bond strength. In some embodiments, wire bond 84 is strong enough that any failure will occur in wire 86 prior to occurring in the interface between wire bond 84 and contact surface 88. Thus, the bond strength may be greater than, less than, or equal to the failure strength of wire 86. In embodiments where wire 86 has diameter 92 of twenty-five μm, five g to twelve g of force may be required to break wire bond 84. In embodiments where wire 86 has diameter 92 of twenty-five μm, seven g to twelve g of force may be required to break wire bond 84. The strength of wire bond 84 may be enhanced by cleaning wire 86 and/or contact surface 88 prior to applying coating 18. In some embodiments, wire 86 and/or contact surface 88 may be treated by gas plasma to achieve a "super clean" surface. Activation and cleaning of wire 86 and/or contact surface 88 by gas plasma may provide stronger wire bonds 84.

In some embodiments, the strength of wire bond 84 may be measured using a pull strength tester. The measurements may be repeated for different thicknesses 24 of coating 18 on contact surface 88 and for different types of wires 86. In one example, a Kullicke & Soffe 4523 wedge wire bonder 90 was used to form wire bonds 84. In this example, the wire bonder 90 was set to the following settings: (i) "First Bond" set to "Power 2.20," "Time 4.0," "Force 3.0=60 g"; (ii) "Second Bond" set to "Power 2.20", "Time 3.0", "Force 3.0=60 g"; (iii) electronics setting of "Long Time" interval. In this example, wire bonder 90 formed wire bonds 84 between wires 86 listed in the table below and a copper contact surface 88 that was coated with coating 18 comprising halo-hydrocarbon polymers. Prior to applying coating 18, the copper contact surface 88 was pre-treated with a liquid based sulphuric acid/hydrogen peroxide solution.

After wire bonds 84 were formed in this example, a Kullicke & Soffe BT22 pull strength tester was used to measure the strength of wire bonds 84. The measurements from this example are listed in the following table:

| Wire material (diameter μm) | Nominal coating thickness (nm) | Average bond strength (g) |
| --- | --- | --- |
| Gold (25 μm) | ~50 | 5.60 |
| Gold (25 μm) | ~80 | 8.46 |
| Aluminium (25 μm) | ~30 | 7.65 |
| Aluminium (25 μm) | ~50 | 10.87 |
| Aluminium (25 μm) | ~80 | 7.00 |
| Copper (25 μm) | ~60 | 8.60 |
| Copper (25 μm) | ~40 | 6.65 |

In this example, the gold and aluminium wires 86 were uncoated and the copper wires 86 were coated with coating 18 comprising halo-hydrocarbon polymers. Prior to coating 18, the copper wires 86 were pre-treated for approximately two minutes using hydrogen plasma. In each of the pull strength tests in this example, it was observed that the point of eventual failure was due to wire 86 breaking rather than wire bond 84 failing. Thus, for this example, the bond strengths in the table effectively represent a lower limit of average bond strengths.

Although the foregoing example illustrates bond strengths for wire bonds 84 between particular types of wires 86 and contact surfaces 88, it should be understood that wire bond 84 may be formed between any suitable type of wire 86 and any suitable type of contact surface 88. Although the foregoing example illustrates a particular type of wire bonder 90, it should be understood that any suitable type of wire bonder 90 may be used to form wire bonds 84. Although the foregoing example illustrates particular thicknesses 24 of coating 18 on contact surface 88, it should be understood that coating 18 on contact surface 88 and/or wire 86 may have any suitable thickness 24. In some embodiments, modifying the surface roughness of wire 86, contact surface 88, and/or coating 18 may increase the strength of wire bond 84. Wire 86, contact surface 88, and/or coating 18 may be configured with the same or different surface roughnesses to optimize wire bonds 84 for various applications. In some embodiments, the surface roughness of wire 86 and/or contact surface 88 may be modified prior to applying coating 18. In some embodiments, surface roughness of coating 18 may be modified after it is applied to wire 86 and/or contact surface 88.

The surface roughness of wire 86, contact surface 88, and/or coating 18 may be controlled on a macro scale (e.g., equal or greater than one µm) and/or on a micro scale (e.g., less than one µm). Modifying the surface roughness and/or flatness of wire 86 and/or contact surface 88 may in effect modify contact area between and/or the frictional characteristics of wire 86 and/or contact surface 88 during the wire bonding process. These types of modifications may allow energy to be efficiently coupled to the region of wire bond 84 during the wire bonding process. These modifications may allow the formation of strong wire bonds 84 between wire 86 and contact surface 88.

The surface roughness, frictional characteristics, and/or surface energy characteristics of wire 86, contact surface 88, and/or coating 18 may be modified by any suitable method such as, for example, gas plasma treatment, liquid/acid etching, mechanical treatment, and/or the selection of precursor compounds 36 for deposition of coating 18 (e.g., chlorine).

In some embodiments, coating 18 is not removed from wire 86 and/or contact surface 88 prior to the wire bonding process. In other embodiments, coating 18 may be selectively removed from wire 86 and/or contact surface 88 prior to the wire bonding process. In yet other embodiments, prior to the wire bonding process, coating 18 may be removed from wire 86 completely and/or from the whole area of contact surface 88. In embodiments where at least a portion of coating 18 is removed prior to the wire bonding process, coating 18 may be removed selectively or from a general area by heating contact surface 88, by laser ablation, by plasma processing, and/or by liquid chemical etching. In such embodiments, coating 18 may be replaced after wire bond 84 is formed. In other embodiments, coating 18 may be applied after wire bonding, either onto a clean contact surface 88 or a pre-coated contact surface 88. Such a step might be considered, for example, where long term stability is required with the option of subsequent processing or rework at a later time. In some embodiments, once wire bond 84 is formed, wire 86, contact surface 88, and/or wire bond 84 are further protected by applying an additional overlayer of coating 18.

Coating 18 may be applied to wire 86 and/or contact surface 88 using any suitable technique. For example, coating 18 may be deposited using chemical vapour deposition (CVD), molecular beam epitaxy (MBE), plasma enhanced-chemical vapour deposition (PE-CVD), high pressure/atmospheric plasma deposition, metalloorganic-chemical vapour deposition (MO-CVD), and/or laser enhanced-chemical vapour deposition (LE-CVD). In some embodiments, coating 18 may be deposited by the creation of inter-penetrating polymer networks (IPNs) and/or by surface absorption of monolayers (SAMs) of polymers or monomers to form in-situ polymers and/or polymer alloys. In other embodiments, coating 18 may be deposited using a liquid coating technique such as, for example, liquid dipping, spray coating, spin coating, sputtering, and/or a sol-gel process. In some embodiments, wire 86 and/or contact surface 88 may be coated with coating 18 shortly after manufacture in order to prevent oxidation.

In some embodiments, coating 18 may be deposited on wire 86 and/or contact surface 88 by plasma deposition, as described above with respect to FIG. 2. In such embodiments, wire 86 and/or contact surface 88 may be placed in chamber 30 and reactor 28 may introduce gases (e.g., hydrogen, argon, and/or nitrogen) into chamber 30 to clean wire 86 and/or contact surface 88. Reactor 28 may then introduce one or more precursor compounds 36 into chamber 30 to form a single-layer coating 18 or multi-layer coating 18 on wire 86 and/or contact surface 88. In some embodiments, coating 18 may encapsulate and/or follow the three dimensional form of wire 86 and/or contact surface 88.

In some embodiments, coating 18 on wire 86 and/or contact surface 88 may comprise a very thin layer (e.g., five nm or less) of a metal halide (preferably metal fluoride) directly in contact with the surface of wire 86 and/or contact surface 88. The thin layer of metal halide may comprise a minimal amount of halo-hydrocarbon material (e.g., less than one percent by weight, less than five percent by weight, etc.). In some embodiments, the metal halide layer may be a monolayer, substantially a monolayer, or a few monolayers. In other embodiments, the metal halide layer may comprise a metal halide zone of layers at the surface of wire 86 and/or contact surface 88. The metal halide layer may be robust, may be inert, and/or may prevent the formation on wire 86 and/or contact surface 88 of oxide layers and/or tarnishes which may prevent effective wire bonding.

In embodiments where coating 18 is applied by plasma deposition, the metal halide layer may form on wire 86 and/or contact surface 88 when active species in the gas plasma react with the metal surface. In some embodiments, the metal halide layer may be enhanced using a higher concentration of fluorine species. A layer of coating 18 comprising a halo-hydrocarbon polymer may then be deposited on and/or in combination with the metal halide layer. The layer of metal halide and the layer of halo-hydrocarbon polymers may be discrete, axially or spatially. Alternatively, there may be a graded transition from metal halide to halo-hydrocarbon polymer in coating 18. In some embodiments, the metal halide layer may protect wire 86 and/or contact surface 88 from oxidation while the layer of halo-hydrocarbon polymers (i) may provide environmental protection from corrosive gases and/or liquids and/or (ii) may provide oxidation protection. Should the layer of halo-hydrocarbon polymers in coating 18 eventually be worn away by mechanical abrasion, the underlying metal halide layer may prevent oxidation build-up, thus protecting and prolonging the life of a device.

In some embodiments, coating 18 may permit wire 86 and/or contact surface 88 to be wire bonded in a non-inert atmosphere without oxidizing. The term non-inert atmosphere refers to an atmosphere comprising gases (e.g., oxygen) that would normally oxidize and/or corrode uncoated wires 86 and/or uncoated contact surfaces 88. As explained above, inert atmospheres were traditionally used to form wire bonds with uncoated copper wires 86. Inert atmospheres typically comprised inert gases such as, for example, nitrogen and/or argon. Because coating 18 may protect wire 86 and/or contact surface 88 from oxidation and/or corrosion, coating 18 may permit wire bond 84 to be formed in a non-inert atmosphere with little or no risk of oxidation. Thus, coating 18 may reduce the cost and/or increase the efficiency of the wire bonding process. It should be understood, however, that coating 18 may be used on wires 86 and/or contact surfaces 88 regardless of whether the wire bond 84 is formed in an inert or non-inert atmosphere.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A printed circuit board, comprising:
    a substrate comprising an insulating material;
    a plurality of conductive tracks attached to at least one surface of the substrate;
    a coating deposited on the at least one surface of the substrate, wherein:
        the coating covers at least a portion of the plurality of conductive tracks; and
        comprises at least one halo-hydrocarbon polymer; and
    at least one conductive wire that is connected by a wire bond to at least one conductive track at a particular region of the substrate, the wire bond formed through the coating without prior removal of the coating such that the wire bond connects the at least one conductive wire directly to the at least one conductive track at the particular region and the coating abuts the wire bond at the particular region.

2. The printed circuit board of claim 1, wherein the wire bond abuts the coating along a plane parallel to the at least one surface of the substrate.

3. The printed circuit board of claim 1, wherein the wire bond is at least one of:
    a ball bond; and
    a wedge bond.

4. The printed circuit board of claim 1, wherein the wire comprises at least one of:
    gold;
    aluminum;
    silver;
    copper;
    nickel; and
    iron.

5. The printed circuit board of claim 1, wherein at least a portion of the wire is covered with the coating.

6. The printed circuit board of claim 1, wherein the coating has a thickness of from 1 nanometers to 2 micrometers.

7. The printed circuit board of claim 1, wherein the coating has a thickness of from 10 nanometers to 100 nanometers.

8. The printed circuit board of claim 1, wherein the at least one halo-hydrocarbon polymer is a fluoro-hydrocarbon polymer.

9. The printed circuit board of claim 1, wherein the wire bond is formed at the particular region of the substrate, the formation of the wire bond altering the coating at the particular region without altering the coating at other regions of the substrate.

10. The printed circuit board of claim 9, wherein:
    the coating is not removed from the particular region of the substrate prior to the formation of the wire bond; and
    the formation of the wire bond alters the coating at the particular region of the substrate by selectively removing the coating from the particular region of the substrate.

11. The printed circuit board of claim 1, further comprising at least one electrical component connected by a solder joint to at least one conductive track, wherein the solder joint is soldered through the coating such that the solder joint abuts the coating.

12. The printed circuit board of claim 1, wherein the wire bond is formed at a first region of the substrate, the first region coated with the coating, and further comprising:
    at least one electrical component connected by a solder joint to at least one conductive track at a second region of the substrate, the second region coated with another coating.

13. The printed circuit board of claim 1, further comprising a contact attached to at least one surface of the substrate, the contact coated with the coating, the contact operable to conduct an electrical signal through the coating to another contact.

14. The printed circuit hoard of claim 1, wherein the coating is deposited such that a metal halide layer covers at least a portion of the plurality of conductive tracks.

15. The printed circuit board of claim 1, wherein the coating is deposited such that there is essentially no metal halide layer between the plurality of conductive tracks and the coating.

* * * * *